United States Patent
Wang

(10) Patent No.: US 11,016,663 B2
(45) Date of Patent: May 25, 2021

(54) MEMORY SYSTEM

(71) Applicant: KIOXIA CORPORATION, Tokyo (JP)

(72) Inventor: Ge Wang, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/807,845

(22) Filed: Mar. 3, 2020

(65) Prior Publication Data

US 2021/0081109 A1    Mar. 18, 2021

(30) Foreign Application Priority Data

Sep. 13, 2019  (JP) .............................. JP2019-167658

(51) Int. Cl.
*G11C 16/04*    (2006.01)
*G06F 3/06*     (2006.01)

(52) U.S. Cl.
CPC .......... *G06F 3/0604* (2013.01); *G06F 3/0653* (2013.01); *G06F 3/0679* (2013.01)

(58) Field of Classification Search
CPC .... G11C 7/04; G11C 11/40626; G11C 29/028
See application file for complete search history.

(56) References Cited

U.S. PATENT DOCUMENTS

| | | | |
|---|---|---|---|
| 8,693,246 B2 | 4/2014 | Roohparvar et al. | |
| 2016/0300816 A1* | 10/2016 | Park | .................... H01L 23/34 |
| 2017/0083259 A1* | 3/2017 | Lee | .................. G11C 11/40626 |
| 2017/0242632 A1* | 8/2017 | Cho | ..................... G06F 3/0688 |
| 2017/0255403 A1* | 9/2017 | Sharon | ............... G11C 11/5642 |
| 2019/0080730 A1 | 3/2019 | Lee et al. | |

* cited by examiner

*Primary Examiner* — Tuan T Nguyen
(74) *Attorney, Agent, or Firm* — Kim & Stewart LLP

(57) ABSTRACT

A memory system includes a nonvolatile memory, a controller, and a temperature sensor. The controller includes an interface circuit that controls an access to the nonvolatile memory. The temperature sensor measures a temperature of the memory system. The controller is configured to acquire a first temperature from the temperature sensor, acquire a first parameter set corresponding to the first temperature from parameter information including a plurality of parameter sets respectively corresponding to plurality of temperatures, and set the first parameter set in the interface circuit.

20 Claims, 17 Drawing Sheets

FIG. 10

| TEMPERATURE[°C] | PHY PARAMETER SET |
|---|---|
| 0 | P0 |
| 1 | P1 |
| 2 | P2 |
| 3 | P3 |
| ... | ... |
| 24 | P24 |
| 25 | P25 |
| 26 | P26 |
| ... | ... |
| 79 | P79 |
| 80 | P80 |

FIG. 12

| TEMPERATURE[°C] | PHY PARAMETER SET |
|---|---|
| 0 | |
| 1 | |
| 2 | |
| 3 | |
| ... | ... |
| 24 | |
| 25 | P25 |
| 26 | P26 |
| ... | ... |
| 79 | |
| 80 | |

FIG. 13

| TEMPERATURE[°C] | PHY PARAMETER SET |
|---|---|
| 0 | |
| 1 | |
| 2 | |
| 3 | |
| ... | ... |
| 24 | P24 |
| 25 | P25 |
| 26 | P26 |
| ... | ... |
| 79 | |
| 80 | |

FIG. 15

| TEMPERATURE[°C] | PHY PARAMETER SET | UPDATE DATE AND TIME | ACTUAL MEASUREMENT/ ESTIMATION |
|---|---|---|---|
| 0 | P0 | 2019/6/1 15:00:00 | ACTUAL MEASUREMENT |
| 1 | P1 | 2019/6/1 15:02:05 | ACTUAL MEASUREMENT |
| 2 | | | |
| 3 | P3 | 2019/6/1 15:03:01 | ACTUAL MEASUREMENT |
| ... | ... | ... | ... |
| 24 | | | |
| 25 | P25 | 2019/6/1 16:11:02 | ACTUAL MEASUREMENT |
| 26 | P26 | 2019/6/1 16:14:15 | ACTUAL MEASUREMENT |
| ... | ... | ... | ... |
| 79 | | | |
| 80 | P80 | 2019/6/1 20:12:05 | ACTUAL MEASUREMENT |

FIG. 16

| TEMPERATURE[°C] | PHY PARAMETER SET | UPDATE DATE AND TIME | ACTUAL MEASUREMENT/ ESTIMATION |
|---|---|---|---|
| 0 | P0 | 2019/6/1 15:00:00 | ACTUAL MEASUREMENT |
| 1 | P1 | 2019/6/1 15:02:05 | ACTUAL MEASUREMENT |
| 2 | P2 | 2019/7/15 9:01:52 | ESTIMATION |
| 3 | P3 | 2019/6/1 15:03:01 | ACTUAL MEASUREMENT |
| ... | ... | ... | ... |
| 24 | P24 | 2019/7/15 9:01:53 | ESTIMATION |
| 25 | P25 | 2019/6/1 16:11:02 | ACTUAL MEASUREMENT |
| 26 | P26 | 2019/6/1 16:14:15 | ACTUAL MEASUREMENT |
| ... | ... | ... | ... |
| 79 | | | |
| 80 | P80 | 2019/6/1 20:12:05 | ACTUAL MEASUREMENT |

FIG. 17

| TEMPERATURE[°C] | PHY PARAMETER SET | UPDATE DATE AND TIME | ACTUAL MEASUREMENT/ ESTIMATION |
|---|---|---|---|
| 0 | P0 | 2019/6/1 15:00:00 | ACTUAL MEASUREMENT |
| 1 | P1 | 2019/6/1 15:02:05 | ACTUAL MEASUREMENT |
| 2 | P2 | 2019/7/15 9:01:52 | ESTIMATION |
| 3 | P3 | 2019/6/1 15:03:01 | ACTUAL MEASUREMENT |
| ... | ... | ... | ... |
| 24 | P24 | 2019/7/15 9:01:53 | ESTIMATION |
| 25 | P25 | 2019/6/1 16:11:02 | ACTUAL MEASUREMENT |
| 26 | P26 | 2019/6/1 16:14:15 | ACTUAL MEASUREMENT |
| ... | ... | ... | ... |
| 79 | P79 | 2019/7/18 9:05:12 | ACTUAL MEASUREMENT |
| 80 | P80 | 2019/6/1 20:12:05 | ACTUAL MEASUREMENT |

MEMORY SYSTEM

CROSS-REFERENCE TO RELATED APPLICATION

This application is based upon and claims the benefit of priority from Japanese Patent Application No. 2019-167658, filed Sep. 13, 2019, the entire contents of which are incorporated herein by reference.

FIELD

Embodiments described herein relate generally to a memory system including a nonvolatile memory.

BACKGROUND

In recent years, memory systems including a nonvolatile memory are widely used. As one such memory system, a solid state drive (SSD) including a NAND flash memory is known. The SSD is used as a main storage for various computing devices.

As an operation speed of the NAND flash memory increases, it is also necessary to increase a speed of a NAND interface that controls access to the NAND flash memory in a memory controller. One method for increasing the speed of the NAND interface is to perform calibration and training for the NAND interface.

Such calibration and training may be performed according to change in an SSD usage environment. For example, calibration and training are performed when a temperature of the SSD changes.

However, when calibration and training are performed on the SSD, there is a possibility that high-speed access to the NAND flash memory cannot be performed at the same time.

DESCRIPTION OF THE DRAWINGS

FIG. 10 is a diagram illustrating a configuration example of a PHY parameter table used in the memory system according to the first embodiment.

FIG. 12 is a diagram illustrating a configuration example of a PHY parameter table used in a memory system according to a second embodiment.

FIG. 13 is a diagram illustrating an example in which the PHY parameter table of FIG. 12 is updated.

FIG. 15 is a diagram illustrating a configuration example of a PHY parameter table used in a memory system according to a third embodiment.

FIG. 16 is a diagram illustrating an example in which the PHY parameter table of FIG. 15 is updated.

FIG. 17 is a diagram illustrating an example in which the PHY parameter table of FIG. 16 is updated.

DETAILED DESCRIPTION

Embodiments provide a memory system that can continue high-speed access to a non-volatile memory even when a temperature changes.

In general, according to one embodiment, there is provided a memory system including a nonvolatile memory, a controller, and a temperature sensor. The controller includes an interface circuit that controls an access to the nonvolatile memory. The temperature sensor measures a temperature of the memory system. The controller is configured to acquire a first temperature from the temperature sensor, acquire a first parameter set corresponding to the first temperature from parameter information including a plurality of parameter sets respectively corresponding to a plurality of temperatures, and set the first parameter set in the interface circuit.

In the following, embodiments will be described with reference to the accompanying drawings.

First Embodiment

Figure 1:
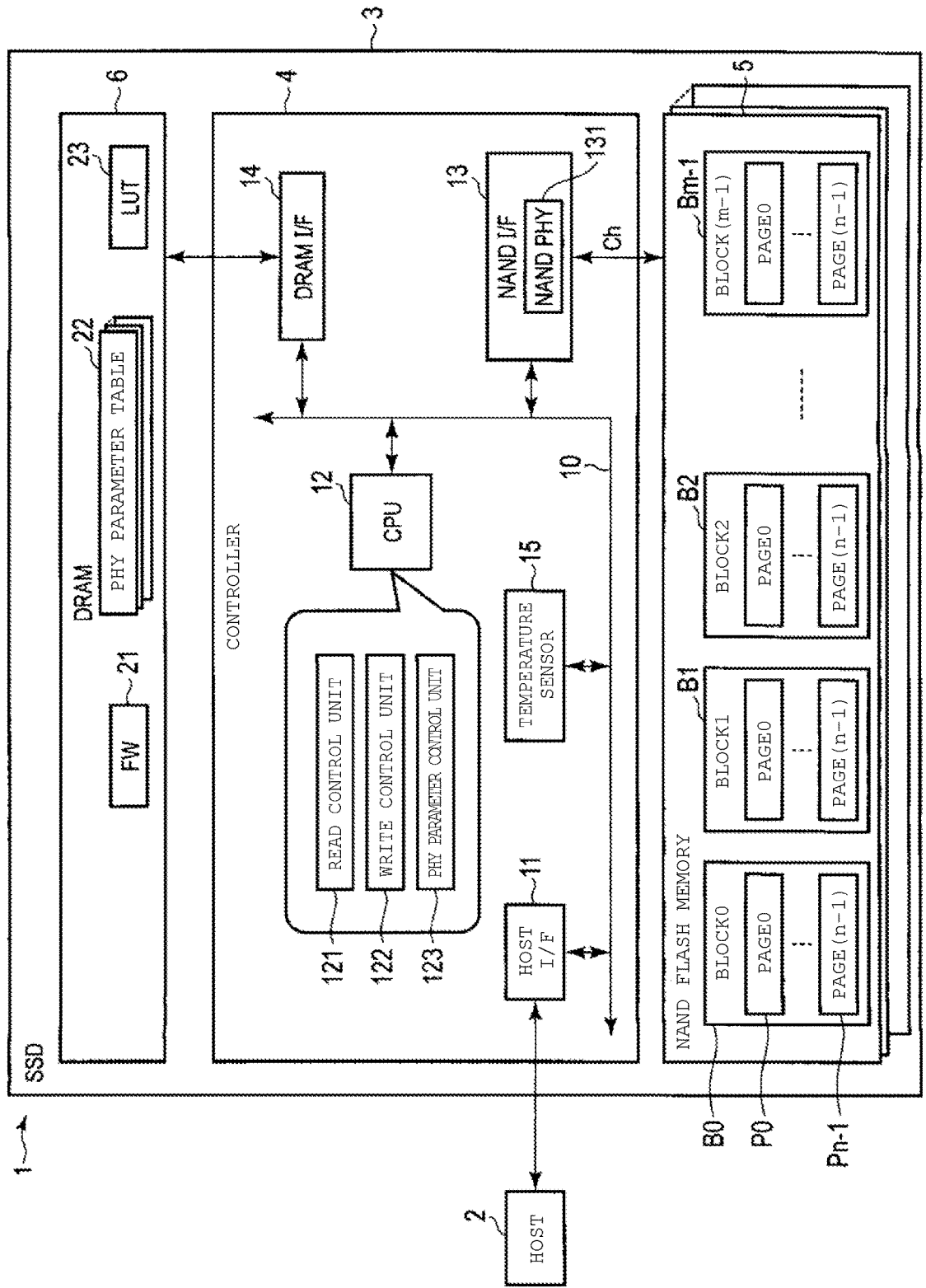
FIG. 1 is a block diagram illustrating a configuration example of a memory system according to a first embodiment.

First, a configuration of an information processing system 1 including a memory system according to a first embodiment will be described with reference to FIG. 1. The memory system is a semiconductor storage device configured to read data from the nonvolatile memory and write the data in the nonvolatile memory such as a NAND flash memory chip 5, and also in which the memory system may also be called a storage device. The memory system is provided, for example, as a solid state drive (SSD) 3 including a plurality of NAND flash memory chips 5. In the following, a case where the memory system (that is, the storage device) is provided as the SSD 3 will be exemplified. The plurality of NAND flash memory chips 5 may be collectively referred to as a NAND flash memory 5.

The information processing system 1 includes a host device 2 (also referred to hereinbelow as host 2) and the SSD 3. The host 2 may be a storage server that stores a large amount of various data in the SSD 3, or may be a personal computer.

The SSD 3 may be used as the storage for an information processing apparatus functioning as the host 2. The SSD 3 may be built in the information processing apparatus or may be connected to the information processing apparatus via a cable or a network.

Interfaces for connecting the host 2 and the SSD 3 conform to the following protocols: SCSI, Serial Attached SCSI (SAS), ATA Attachment (ATA), Serial ATA (SATA), PCI Express® (PCIe), Ethernet®, Fibre channel, and NVM Express® (NVMe), and the like.

The SSD 3 includes a controller 4 and the NAND flash memory 5. The controller 4 may be implemented by a circuit such as a System-on-a-chip (SoC).

The SSD 3 may include a random access memory (RAM) that is a volatile memory, for example, a dynamic random access memory (DRAM) 6. Alternatively, a RAM such as a static random access memory (SRAM) may be built in the controller 4. The DRAM 6 may be built in the controller 4.

A RAM such as the DRAM 6 is provided with a storage area for firmware (FW) 21 loaded from the NAND flash memory 5 and a cache area for a PHY parameter table 22. Information managed in the PHY parameter table 22 is control information including PHY parameters used for controlling signal transmission between the controller 4 and the NAND flash memory 5 according to a temperature of the SSD 3. For example, the PHY parameter corresponding to the current temperature of the SSD 3 is acquired from the PHY parameter table 22, and the timing at which the signal is transmitted is adjusted using the PHY parameter. When a plurality of NAND flash memory chips 5 are connected to one channel (Ch), a plurality of PHY parameter tables 22 respectively corresponding to the plurality of NAND flash memory chips 5 are used. The channel includes at least a data signal (DQ), a data strobe signal (DQS), and a read enable signal (RE). Details of the PHY parameter table 22 will be described later with reference to FIG. 10.

The RAM such as the DRAM 6 is provided with a buffer area for temporarily storing data written to the NAND flash memory 5 and data read from the NAND flash memory 5. The RAM such as the DRAM 6 may be provided with a cache area of a lookup table (LUT) 23 that functions as a logical-to-physical address conversion table. The LUT 23 manages mapping between each logical address (for example, logical block address (LBA)) and each physical address of the NAND flash memory 5.

The NAND flash memory 5 includes a plurality of blocks B0 to Bm−1. Each of the blocks B0 to Bm−1 includes a plurality of pages (here, pages P0 to Pn−1). Each of blocks B0 to Bm−1 functions as the minimum unit of a data erasing operation. The block may be referred to as an "erase block" or a "physical block". Each of pages P0 to Pn−1 includes a plurality of memory cells connected to the same word line. Each of the pages P0 to Pn−1 is unit of a data write operation or a data read operation. A word line may be used as unit of a data write operation and a data read operation.

The number of program/erase cycles (number of P/E cycles) for each of the blocks B0 to Bm−1 has an upper limit, which is referred to as the maximum number of P/E cycles. One P/E cycle of a block includes an erasing operation for setting all memory cells in the block to an erase state, and a write operation for writing data to each of the pages of the block.

Before shipment of the SSD 3, FW 21 and the PHY parameter table 22 are stored in the NAND flash memory 5.

The controller 4 is electrically connected to the NAND flash memory 5 via a NAND interface (NAND I/F) 13 corresponding to an interface standard such as Toggle DDR, Open NAND Flash Interface (ONFI) or the like. The NAND I/F 13 functions as a NAND control circuit configured to control the NAND flash memory 5.

The NAND I/F 13 may be connected to a plurality of NAND flash memory chips 5 through a plurality of channels (Ch), respectively. By driving the plurality of NAND flash memory chips 5 in parallel, the bandwidth for an access to the entire NAND flash memory can be increased.

The NAND I/F 13 includes a NAND PHY 131 that provides a function of a physical layer. The NAND PHY 131 includes one or more components. Each component is an analog circuit, an analog element, or the like.

The NAND PHY 131 is an interface circuit that physically controls transmission of various signals between the controller 4 and the NAND flash memory 5. The NAND PHY 131 may adjust the timing at which each signal is transmitted, for example. More specifically, the timing at which each signal is transmitted may be adjusted by changing a PHY parameter set in one or more components in the NAND PHY 131. For example, the timing at which a certain signal is transmitted may be delayed by changing a delay amount set in a delay element in the NAND PHY 131.

The controller 4 functions as a memory controller configured to control the NAND flash memory 5.

The controller 4 may include a host interface (host I/F) 11, a CPU 12, a NAND I/F 13, a DRAM interface (DRAM I/F) 14, a temperature sensor 15, and the like. The host I/F 11, the CPU 12, the NAND I/F 13, the DRAM I/F 14, and the temperature sensor 15 may be connected via the bus 10.

The host I/F 11 functions as a circuit that receives various commands, for example, an I/O command and various control commands from the host 2. The I/O command may include a write command and a read command. The control command may include an unmap command (trim command) and a format command. The format command is a command for unmapping the entire SSD 3.

The DRAM interface 14 functions as a DRAM control circuit configured to control access to the DRAM 6. The storage area of the DRAM 6 is allocated to an area for storing the FW 21, the PHY parameter table 22, the LUT 23, and the like, and a buffer area used as a read/write buffer.

The temperature sensor 15 measures a temperature of the SSD 3. For example, the temperature sensor 15 periodically measures the temperature of the SSD 3. In FIG. 1, while an example in which the temperature sensor 15 is provided in the controller 4 is illustrated, the temperature sensor 15 may be provided in the SSD 3 or attached to the front surface of the SSD 3. For example, the temperature sensor 15 may be provided in the NAND flash memory 5. The temperature sensor 15 may send the measured temperature to each unit in the controller 4 via the bus 10.

The CPU 12 is a processor configured to control the host I/F 11, NAND I/F 13, and DRAM I/F 14. The CPU 12 performs various processes by executing the FW 21 loaded from the NAND flash memory 5 to the DRAM 6. The FW 21 is a control program including a group of instructions for causing the CPU 12 to execute various processes. The CPU 12 may execute a command process for processing various commands from the host 2. An operation of the CPU 12 is controlled by the FW 21 described above executed by the CPU 12. A part or all of the command process may be executed by dedicated hardware in the controller 4.

The controller 4 further has a function of controlling a PHY parameter set which is set in the NAND PHY 131. The PHY parameter set includes one or more PHY parameters to be respectively set for one or more components in the NAND PHY 131. That is, setting a PHY parameter set in the NAND PHY 131 corresponds to setting one or more PHY parameters in one or more components in the NAND PHY 131, respectively.

Incidentally, as the operation speed of the NAND flash memory 5 increases, the NAND I/F 13 that controls access to the NAND flash memory 5 needs to be increased in speed. A method for increasing the speed of the NAND I/F 13 may include setting a PHY parameter suitable for the temperature of the SSD 3 in the NAND PHY 131 that provides the function of the physical layer of the NAND I/F 13.

In the NAND PHY 131, for example, the PHY parameter set suitable for adjusting the timing of signal transmission via the NAND PHY 131 is set according to the temperature of the SSD 3. With this configuration, the timing between a plurality of signals transmitted via the NAND PHY 131 can be precisely adjusted according to the temperature, and signal quality can be improved.

Such a PHY parameter set is obtained by calibration and training for the NAND PHY 131. However, when frequency of calibration and training or the number of PHY parameters to be set increases in order to operate the NAND I/F 13 at a higher speed, the time and power consumption required for acquiring the PHY parameter set increase. For that reason, when the temperature of SSD 3 changes, there is a possibility that high-speed access to the NAND flash memory 5 cannot be continued due to calibration and training for acquiring the PHY parameter set.

For that reason, in the first embodiment, the PHY parameter set which is set in the NAND PHY 131 is updated according to the temperature change of the SSD 3 using a plurality of PHY parameter sets corresponding to a plurality of temperatures stored in the NAND flash memory 5 before shipment of the SSD 3. With this configuration, the PHY parameter set which is set in the NAND PHY 131 can be updated without performing calibration and training when the temperature of the SSD 3 changes, and thus high-speed access to the NAND flash memory 5 can be continuously performed. Furthermore, the power consumption of SSD 3 can be reduced by not performing unnecessary calibration and training.

As a case where the temperature of the SSD 3 changes, not only a case where the temperature of the SSD 3 is changed during the operation of the SSD 3, but also a case where the temperature of the SSD 3 is newly acquired, such as a case where the SSD 3 is started up or restarted, may also be included. Since the time required for startup is evaluated as an index of performance of the entire SSD 3, it is desirable to shorten the time required for the startup. In the first embodiment, even when the SSD 3 is started or restarted, high-speed access to the NAND flash memory 5 can be started quickly by setting a PHY parameter set corresponding to the temperature of the SSD 3 in the NAND PHY 131 using a plurality of PHY parameter sets in accordance with a plurality of temperatures stored in the NAND flash memory 5 before shipment of the SSD 3.

In the NAND flash memory 5, a PHY parameter table 22 is stored before the SSD 3 is shipped. The PHY parameter table 22 includes a plurality of PHY parameter sets corresponding to a plurality of temperatures, for example. The plurality of temperatures are plurality of temperatures at specific temperature intervals within a temperature range in which the SSD 3 can operate. The temperature range is a temperature range in which the SSD 3 designed according to the environment, in which it is assumed to be used, can operate, such as 0° C. to 80° C., −40° C. to 100° C. The temperature range in which the SSD 3 can operate may be set so as to further include an excessive temperature range. For example, when the temperature range in which the SSD 3 can operate is 0° C. to 80° C., a temperature range of −5° C. to 85° C. is set including an excessive temperature range of 5° C. In the NAND flash memory 5, the PHY parameter table 22 corresponding to a temperature range, in which the SSD 3 including the excessive temperature range can operate, can be stored. The specific temperature interval is, for example, a 1° C. interval, but may be any temperature interval such as a 2° C. interval or a 0.5° C. interval.

In order to store the PHY parameter table 22 in the NAND flash memory 5, at least one of calibration and training (in the following, also referred to as calibration/training) for the NAND PHY 131 is performed in the SSD 3 before shipment. The calibration and training for NAND PHY 131 includes, for example, delay calibration, I/O duty calibration of the RE, I/O duty calibration of the DQS, read training of centering, read training of bit skew, write training of centering, and write training of bit skew.

Several examples of these calibrations and training will be described with reference to FIGS. 2 to 6.

Figure 2:
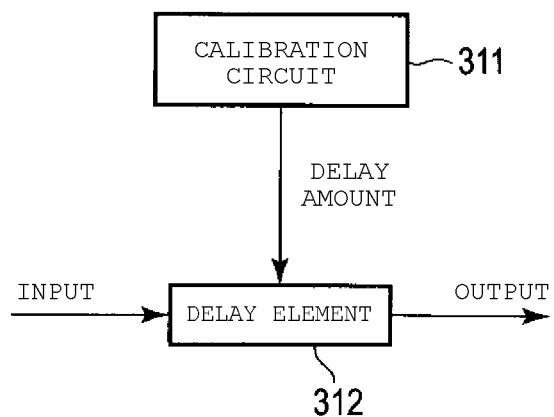
FIG. 2 is a block diagram illustrating a configuration example related to calibration in the memory system according to the first embodiment.

FIG. 2 illustrates a configuration example in the NAND PHY 131 related to the delay calibration. When data writing into the NAND flash memory 5 is performed or data reading from the NAND flash memory 5 is performed, the phases of DQ and DQS needs to be shifted by a quarter cycle. In order to cause this phase shift, a calibration circuit 311 and an analog delay element 312 in the NAND PHY 131 are generally used.

The calibration circuit 311 is an arithmetic unit for calculating a delay amount for causing the phase shift. The calibration circuit 311 continuously operates, for example, in order to maintain accuracy of the calculated delay amount.

The latest delay amount calculated by the calibration circuit 311 is set in the analog delay element 312 before data writing to the NAND flash memory 5 or data reading from the NAND flash memory 5 is performed. With this configuration, an appropriate phase shift can be generated between the DQ and the DQS.

Before shipment of the SSD 3, the delay calibration described above is performed at each temperature within the temperature range in which the SSD 3 can operate. With this configuration, the PHY parameter table 22 in which the delay amount in accordance with each temperature for the phase shift between the DQ and the DQS is included as a PHY parameter set can be created.

Figure 3:
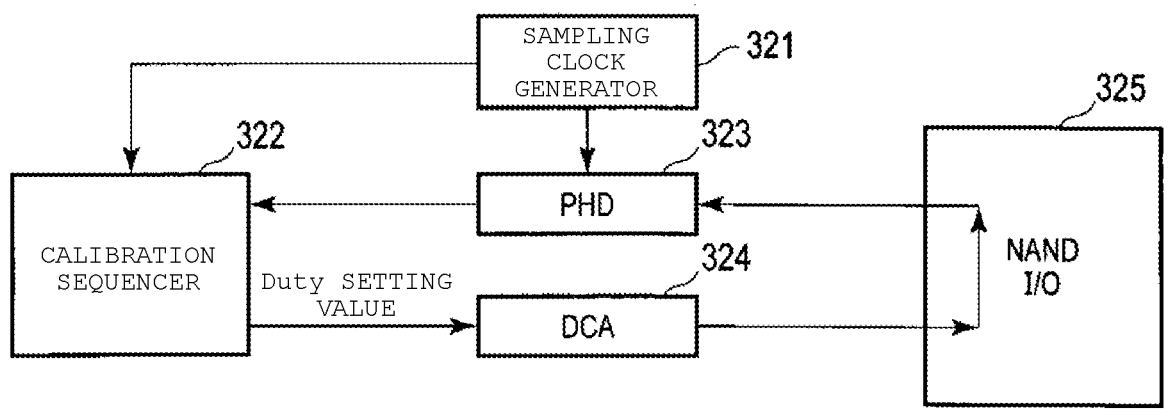
FIG. 3 is a block diagram illustrating another configuration example related to the calibration in the memory system according to the first embodiment.

FIG. 3 illustrates a configuration example in the NAND PHY 131 related to the I/O duty calibration of the RE and the IO duty calibration of the DQS. When data writing to the NAND flash memory 5 is performed, it is ideal that the duty cycle of DQS is close to 50%. When data reading from the NAND flash memory 5 is performed, it is ideal that the duty cycle of RE and DQS is close to 50%. For example, before high-speed data transfer is performed, in order to bring the duty cycle of RE and DQS closer to 50%, a sampling clock generator 321, a calibration sequencer 322, a phase detector (PHD) 323, and a duty cycle adjustment module (DCA) 324, and a NAND input/output unit (NAND I/O) 325 in the NAND PHY 131 are used.

The sampling clock generator 321 generates a sampling clock signal. The PHD 323 detects a phase difference between input signals.

The calibration sequencer 322 is an arithmetic unit for calculating a duty set value for bringing the duty cycles of RE and DQS closer to 50%. The calibration sequencer 322 sets a certain duty setting value in the DCA 324 and calculates an appropriate duty setting value by using the phase difference between the signal obtained from the NAND I/O 325 and the sampling clock signal.

Before shipment of the SSD 3, the I/O duty calibration of RE and the I/O duty calibration of DQS described above are performed at each temperature within the temperature range in which the SSD 3 can operate. With this configuration, the PHY parameter table 22 in which the duty setting values of the RE and DQS are included as a PHY parameter set can be created.

Figure 4:
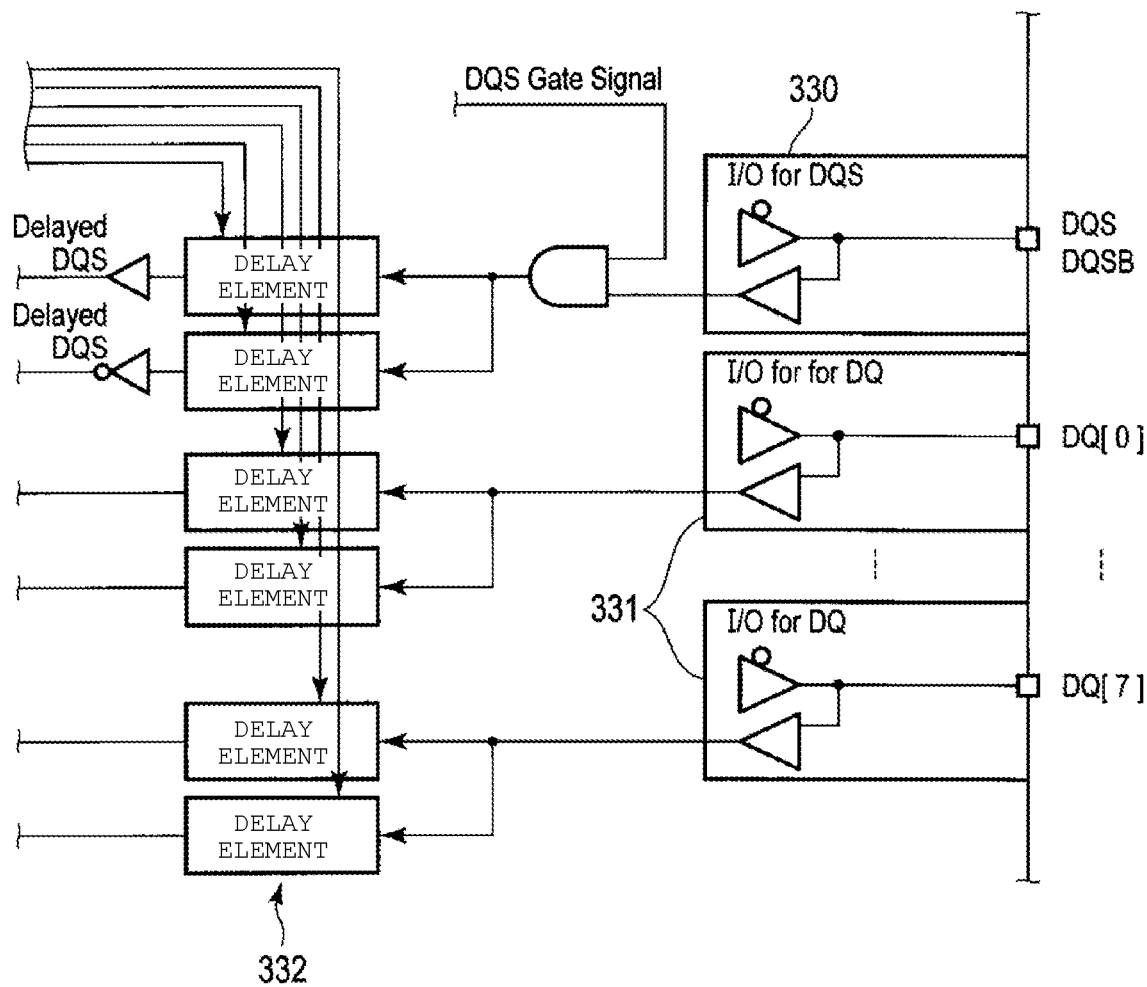
FIG. 4 is a block diagram illustrating a configuration example related to read training in the memory system according to the first embodiment.

FIG. 4 illustrates a configuration example in the NAND PHY 131 related to read training. In the read training, for example, training of the DQS and 8-bit DQ[0] to DQ[7] is performed via the input/output unit (I/O for DQS) 330 and the input/output unit (I/O for DQ) 331, and the delay amounts set in the delay elements 332 respectively corresponding to the DQS and 8-bit DQ[0] to DQ[7] are adjusted based on the training result. With this configuration, the transmission timings of the DQS and DQ[0] to DQ[7] can be adjusted.

Figure 5:
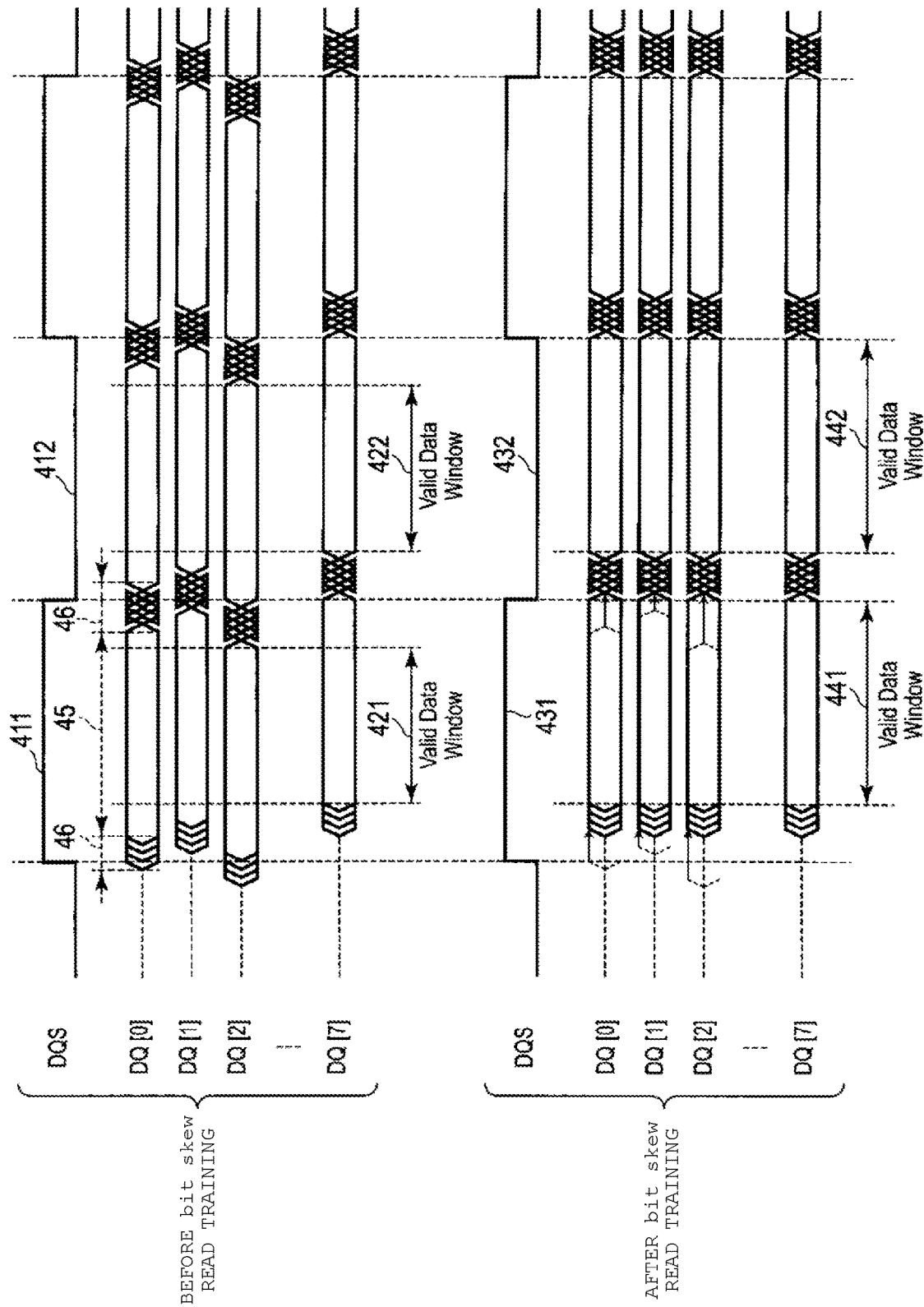
FIG. 5 is a diagram illustrating an example of read training of bit skew in the memory system of the first embodiment.

FIG. 5 illustrates an example in which the transmission timing of the 8-bit DQ[0] to DQ[7] is adjusted by the read training of bit skew. In the following, a position where a value of the DQS changes is referred to as an edge of the DQS. In FIG. 5, an example of a data section 45 in which data can be acquired and a transition section 46 in which data cannot be acquired, which are included in DQ[0], is illustrated. DQ[0] includes a plurality of data sections 45 and a plurality of transition sections 46. Similarly, each of DQ[1] to DQ[7] includes a plurality of data sections 45 and a plurality of transition sections 46. An end portion of each of the data sections 45 in DQ[0] to DQ[7] is referred to as an edge of DQ.

As illustrated in FIG. 5, in the sections 411 and 412 based on the DQS edge, edges of DQ[0] to DQ[7] before training of bit skew are not aligned. For that reason, valid data windows 421 and 422 corresponding to the portion where the data sections 45 of DQ[0] to DQ[7] overlap are narrow.

On the other hand, in DQ[0] to DQ[7] after being subjected to the read training of bit skew, an appropriate delay amount is set in the delay element 332 corresponding to each bit according to communication with the NAND flash memory 5 in each of the sections 431 and 432 based on the edge of the DQS, and thus the edges of each DQ are aligned. With this configuration, wide valid data windows 441 and 442 are obtained in the respective sections 431 and 432 of the DQS.

Figure 6:
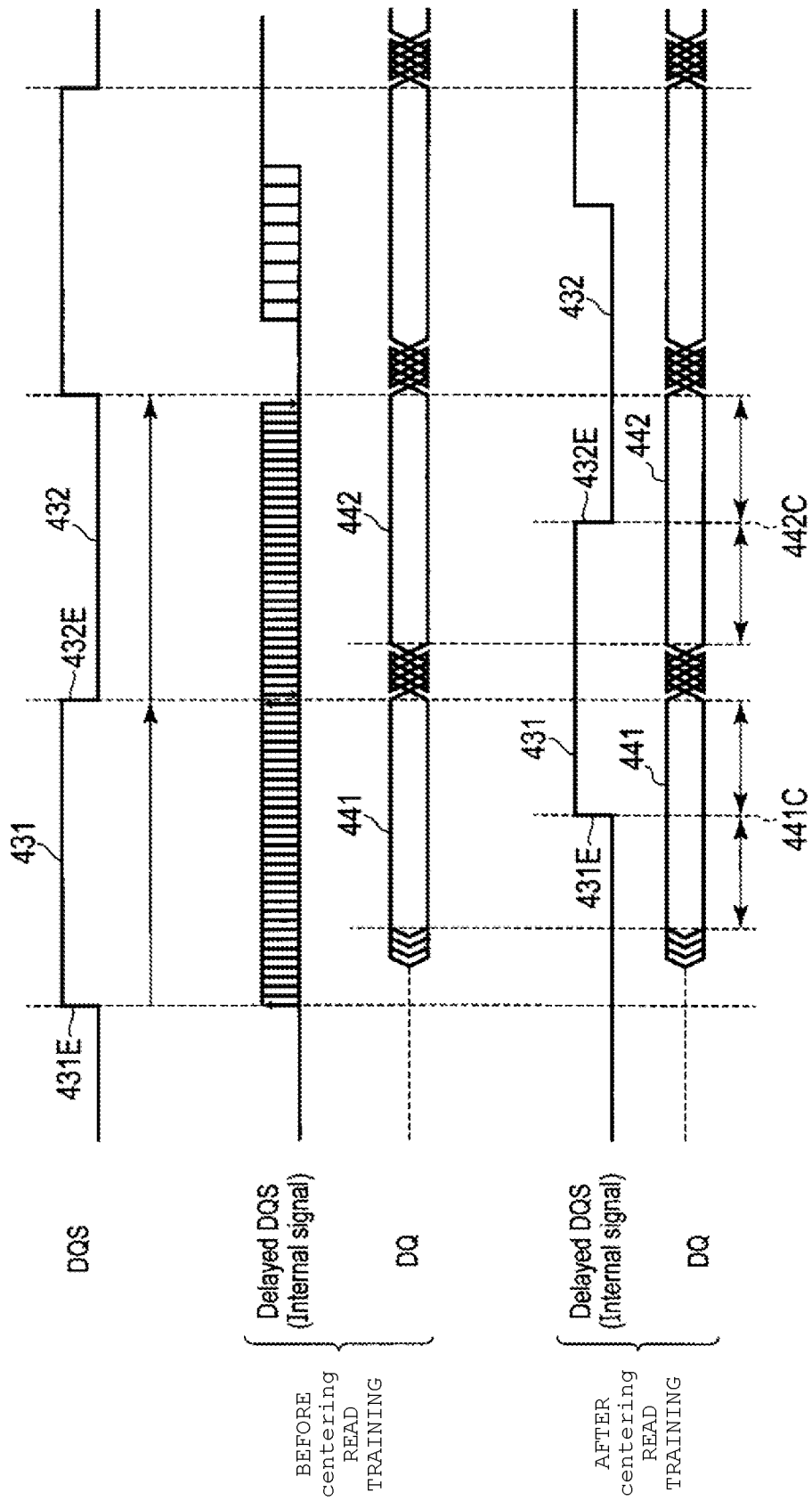
FIG. 6 is a diagram illustrating an example of read training of centering in the memory system of the first embodiment.

FIG. 6 illustrates an example in which the transmission timing of DQS is adjusted by the read training of centering. In the example illustrated in FIG. 6, it is assumed that the read training of centering is performed for DQ[0] to DQ[7] (that is, DQ[0] to DQ[7] with aligned edges) being subjected to the read training of bit skew. For that reason, FIG. 6 illustrates any one of DQ[0] to DQ[7] as the DQ.

Data included in the DQ can be stably acquired by being sampled (captured) at a position away from the transition section 46 of DQ. For that reason, it is necessary to delay the DQS with respect to the DQ so that the edges 431E and 432E (that is, the sampling time) of the DQS coincide with the centers of the valid data windows 421 and 422.

When the read training of centering is performed, an appropriate delay amount is set in the delay element 332 corresponding to the DQS according to the communication with the NAND flash memory 5. With this configuration, the edges 431E and 432E of the delayed DQS coincide with the centers 441C and 442C of the valid data windows 441 and 442, respectively.

Before shipment of the SSD 3, the read training of bit skew and read training of centering described above are performed at each temperature within the temperature range in which the SSD 3 can operate. With this configuration, the delay amounts to be set in the delay elements 332 respectively corresponding to the DQS and DQ[0] to DQ[7] are calculated. Accordingly, the PHY parameter table 22 in which the delay amount of the delay element 332 corresponding to each temperature is included as a PHY parameter set can be created.

Figure 7:
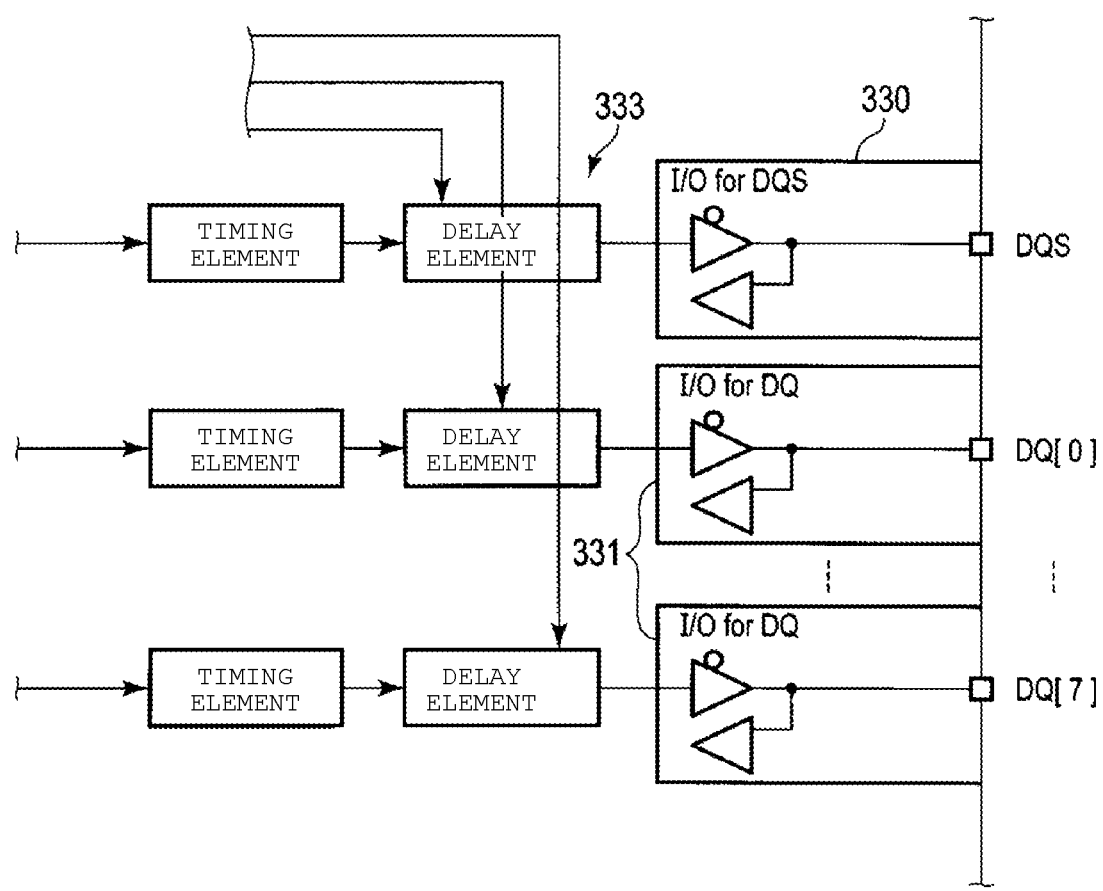
FIG. 7 is a diagram illustrating an example of a configuration related to write training in the memory system according to the first embodiment.

FIG. 7 illustrates a configuration example in the NAND PHY 131 related to write training. In the write training, for example, write training of the 8-bit DQ[0] to DQ[7] is performed via the input/output unit (I/O for DQS) 330 and the input/output unit (I/O for DQ) 331, and the delay amounts set in the delay elements 333 respectively corresponding to the DQS and 8-bit DQ[0] to DQ[7] are adjusted based on the training result. With this configuration, the transmission timing of DQS and DQ[0] to DQ[7] can be adjusted.

Figure 8:
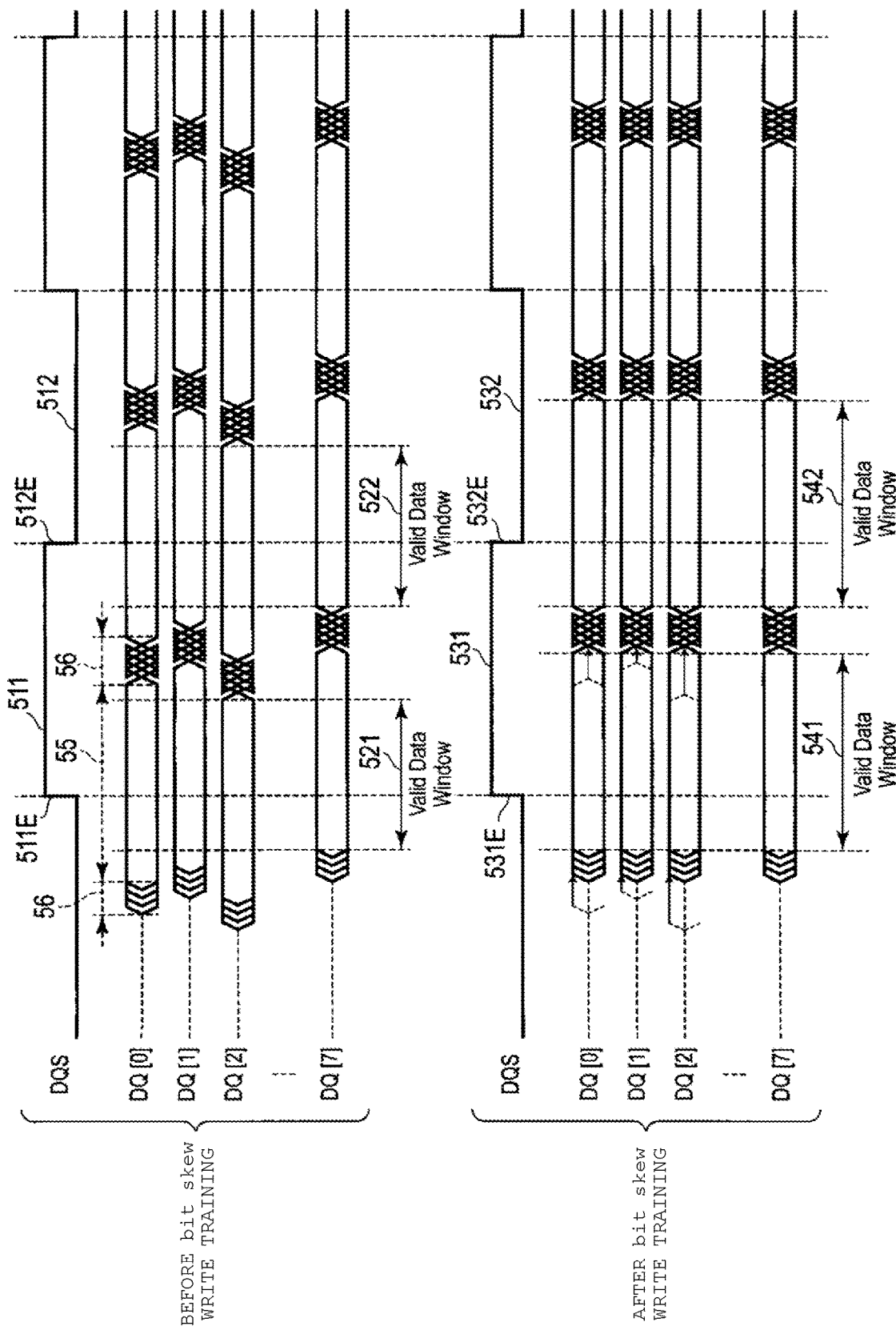
FIG. 8 is a diagram illustrating an example of write training of bit skew in the memory system according to the first embodiment.

FIG. 8 illustrates an example in which the transmission timing of 8-bit of DQ[0] to DQ[7] is adjusted by write training of bit skew. The DQ[0] includes a plurality of data sections 55 and a plurality of transition sections 56. Similarly, each of DQ[1] to DQ[7] includes a plurality of data sections 55 and a plurality of transition sections 56.

As illustrated in FIG. 8, the edges of DQ[0] to DQ[7] before the write training of bit skew are not aligned. For that reason, valid data windows 521 and 522 corresponding to a portion where the data sections 55 of DQ[0] to DQ[7] overlap are narrow. Each data section 55 of DQ[0] to DQ[7] used for determining the valid data window 521 is a section including a time corresponding to an edge 511E of the DQS. Each data section 55 of DQ[0] to DQ[7] used for determining the valid data window 522 is a section including a time corresponding to an edge 512E of the DQS.

On the other hand, in DQ[0] to DQ[7] after being subjected to the write training of bit skew, an appropriate delay amount is set in the delay element 333 corresponding to each bit according to the communication with the NAND flash memory 5, and thus the edges of each DQ are aligned. With this configuration, wide valid data windows 541 and 542 are obtained. Each data section 55 of DQ[0] to DQ[7] used for determination of the valid data window 541 is a section including a time corresponding to an edge 531E of the DQS. Each data section 55 of DQ[0] to DQ[7] used for determining the valid data window 542 is a section including a time corresponding to an edge 532E of the DQS.

Figure 9:
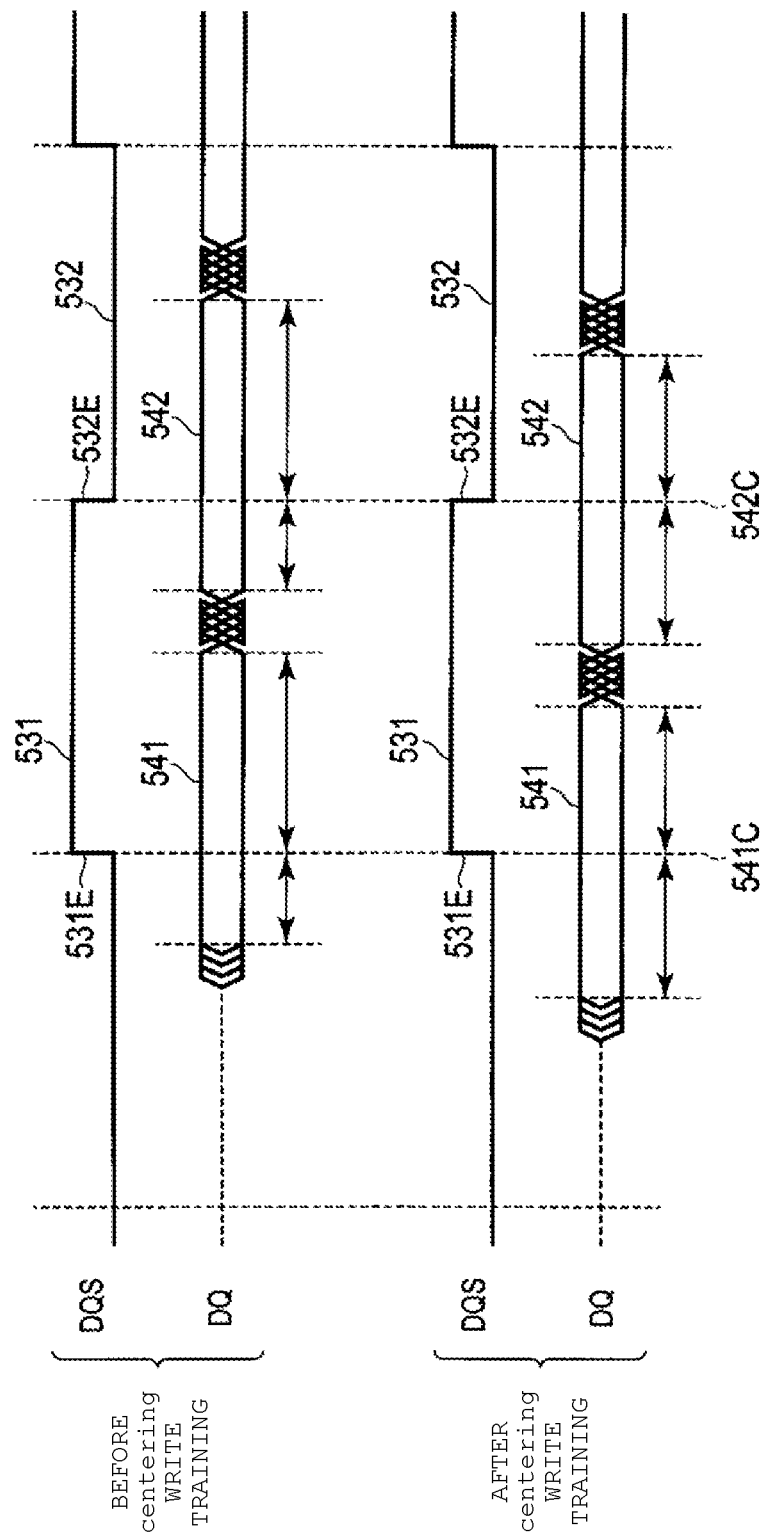
FIG. 9 is a diagram illustrating an example of write training of centering in the memory system according to the first embodiment.

FIG. 9 illustrates an example in which the DQS transmission timing is adjusted by the write training of centering. In the example illustrated in FIG. 9, it is assumed that the write training of centering is performed on DQ[0] to DQ[7] (that is, DQ[0] to DQ[7] with aligned edges) after being subjected to the write training of bit skew. For that reason, FIG. 9 illustrates any one of DQ[0] to DQ[7] as the DQ.

Data included in the DQ can be stably acquired by being sampled (captured) at a position away from the transition section 56 of the DQ. For that reason, it is necessary to delay the DQS with respect to the DQ so that the edges 531E and 532E (that is, the sampling time) of the DQS coincide with the centers of the valid data windows 521 and 522.

When the write training of centering is performed, an appropriate delay amount is set in the delay element 333 corresponding to the DQS according to the communication with the NAND flash memory 5. With this configuration, the centers 541C and 542C of the valid data windows 541 and 542 based on DQ[0] to DQ[7] coincide with the edges 531E and 532E of the delayed DQS, respectively.

Before shipment of the SSD 3, the write training of bit skew and write training of centering described above are performed at each temperature within the temperature range in which the SSD 3 can operate. With this configuration, the delay amounts to be set in the delay elements 333 respectively corresponding to the DQS and DQ[0] to DQ[7] are calculated. Accordingly, the PHY parameter table 22 in which the delay amount of the delay element 333 corresponding to each temperature is included as a PHY parameter set can be created.

By performing the calibration/training as described above with the SSD 3 set to a plurality of temperatures, respectively, before shipment of the SSD 3, the PHY parameter table 22 including a PHY parameter set based on the calibration/training result can be created. The PHY parameter table 22 is stored in the NAND flash memory 5 in the SSD 3.

Various calibration/training for the NAND PHY 131 may be performed instead of or in addition to the examples of calibration/training described above. That is, any calibration/training may be performed as long as the PHY parameters to be set for the components in the NAND PHY 131 are acquired.

Description will be made by referring back to FIG. 1. The CPU 12 may function as, for example, a read control unit 121, a write control unit 122, and a PHY parameter control unit 123. These units 121, 122, and 123 are provided, for example, when the CPU 12 executes the FW 21 loaded from the NAND flash memory 5 to the DRAM 6.

The read control unit 121 obtains a physical address corresponding to a logical address based on an entry of the LUT 23 corresponding to the logical address, and reads data in accordance with a read command from the NAND flash memory 5.

The write control unit 122 accumulates the write command and user data received from the host 2 in a write buffer on the DRAM 6. When it is requested to write the user data to a certain logical address by this write command, the write control unit 122 determines a physical address where the user data is to be written. Then, the write control unit 122 requests the NAND flash memory 5 to write the user data in the block and page corresponding to the determined physical address. More specifically, the write control unit 122 sends information indicating the physical address (for example, the block and page) and user data to the NAND flash memory 5.

Next, the write control unit 122 instructs the NAND flash memory 5 to program. That is, the write control unit 122 causes the NAND flash memory 5 to program the transmitted user data into a write destination block and page by sending a program command to the NAND flash memory 5.

The NAND flash memory 5 includes a plurality of blocks. Blocks are broadly divided into blocks that store valid data (active blocks) and blocks (free blocks) that do not store valid data and may be used to write new data through an erase process. One block is selected from one or more free blocks, and is assigned as a write destination block through an erase process. The write destination block may store valid data.

The write control unit 122 releases an area where the sent user data is accumulated in the write buffer. The write control unit 122 maps the logical address and the physical address. This mapping is recorded in an entry of the LUT 23.

The PHY parameter control unit 123 loads the PHY parameter table 22 from the NAND flash memory 5 to the DRAM 6 in response to the startup of SSD 3.

The PHY parameter control unit 123 acquires the current temperature of the SSD 3 measured by the temperature sensor 15 and acquires a PHY parameter set corresponding to this temperature from the PHY parameter table 22. Then, the PHY parameter control unit 123 sets the acquired PHY parameter set in the NAND PHY 131. More specifically, the PHY parameter control unit 123 sets one or more PHY parameters included in the acquired PHY parameter set in one or more components in the NAND PHY 131, respectively.

Furthermore, When the temperature acquired from the temperature sensor 15 changes, for example, when the new current temperature acquired from the temperature sensor 15 and the temperature acquired immediately before are different from each other by a threshold value or more, the PHY parameter control unit 123 acquires a PHY parameter set corresponding to the new current temperature from the PHY parameter table 22 and sets the PHY parameter set in the NAND PHY 131. As described above, the PHY parameter table 22 includes a plurality of PHY parameter sets corresponding to a plurality of temperatures, for example. When the first temperature in the PHY parameter table 22 closest to the new current temperature acquired from the temperature sensor 15 is different from second temperature in the PHY parameter table 22 closest to the temperature acquired immediately before, the PHY parameter control unit 123 acquires the PHY parameter set corresponding to the first temperature from the PHY parameter table 22 and sets the PHY parameter set in the NAND PHY 131. That is, one or more PHY parameters respectively set for one or more components in the NAND PHY 131 are updated with one or more PHY parameters included in the PHY parameter set corresponding to the new current temperature.

With the configuration described as above, each unit, that accesses the NAND flash memory 5, such as the read control unit 121 and the write control unit 122 accesses the NAND flash memory 5 via the NAND PHY 131 in which a PHY parameter set suitable for the current temperature of the SSD 3 is set. With this configuration, the timing between a plurality of signals transmitted via the NAND PHY 131 is precisely adjusted according to the current temperature of the SSD 3, and thus quality of the signals transmitted and received according to the operation by the read control unit 121 and the write control unit 122 is improved. The same effect can also be obtained in access to the NAND flash memory 5 via the NAND PHY 131 by various control units other than the read control unit 121 and the write control unit 122.

As described above, the PHY parameter set which is set in the NAND PHY 131 is updated according to the temperature change of the SSD 3 using the PHY parameter table 22 including a plurality of PHY parameter sets corresponding to a plurality of temperatures stored in the NAND flash memory 5 before shipment of the SSD 3. With this configuration, when the temperature of the SSD 3 changes, the PHY parameter set which is set in the NAND PHY 131 can be updated without performing calibration and training, and thus the NAND flash memory 5 can be continuously accessed. That is, when the temperature of the SSD 3 changes, the PHY parameter set which is set in the NAND PHY 131 can be quickly updated using the PHY parameter table 22 stored before shipment of the SSD 3 without stopping access to the NAND flash memory 5 for calibration and training. Since calibration and training need not be performed on the SSD 3, the influence on resources of the SSD 3 related to the update of the PHY parameter set and the power consumption can be reduced.

FIG. 10 illustrates a configuration example of the PHY parameter table 22. The PHY parameter table 22 is created based on the result of calibration/training performed before shipment of the SSD 3, for example, and stored in the NAND flash memory 5. Accordingly, the PHY parameter table 22 is stored in the NAND flash memory 5 of the SSD 3 at the time of shipment.

The PHY parameter table 22 includes a plurality of records. The plurality of records correspond to a plurality of temperatures at specific intervals in a temperature range in which the SSD 3 can operate. Each record includes, for example, a temperature field and a PHY parameter set field.

In a record corresponding to a certain temperature, the temperature field indicates the temperature. The PHY parameter set field indicates a PHY parameter set to be set in the NAND PHY 131 when the temperature of the SSD 3 (that is, the temperature measured using the temperature sensor 15) corresponds to the measured temperature. The PHY parameter set includes one or more PHY parameters. One or more PHY parameters may be set for one or more components (circuits, elements, and the like) of the NAND PHY 131, respectively. The one or more PHY parameters may include a PHY parameter related to a read operation and a PHY parameter related to a write operation.

In the example illustrated in FIG. 10, the PHY parameter table 22 includes 81 records corresponding to a plurality of temperatures at 1° C. intervals in the temperature range from 0° C. to 80° C. In the record corresponding to 0° C., a PHY parameter set P0, which is to be set in the NAND PHY 131 when the SSD 3 is 0° C., is included. In the record corresponding to 1° C., a PHY parameter set P1, which is to be set in the NAND PHY 131 when the SSD 3 is 1° C., is included. Similarly, in a record corresponding to each subsequent temperature, a PHY parameter set, which is to be set in the NAND PHY 131 when the SSD 3 is at that temperature, is included.

The controller 4 can obtain a PHY parameter set suitable for the current temperature of the SSD 3 by referring to the PHY parameter table 22.

The SSD 3 may use one or more PHY parameter tables each including one or more PHY parameters corresponding to each temperature, instead of the PHY parameter table 22 including the PHY parameter set corresponding to each temperature. In this case, the controller 4 acquires PHY parameters suitable for the current temperature of the SSD 3 from the one or more PHY parameter tables, respectively.

Figure 11:
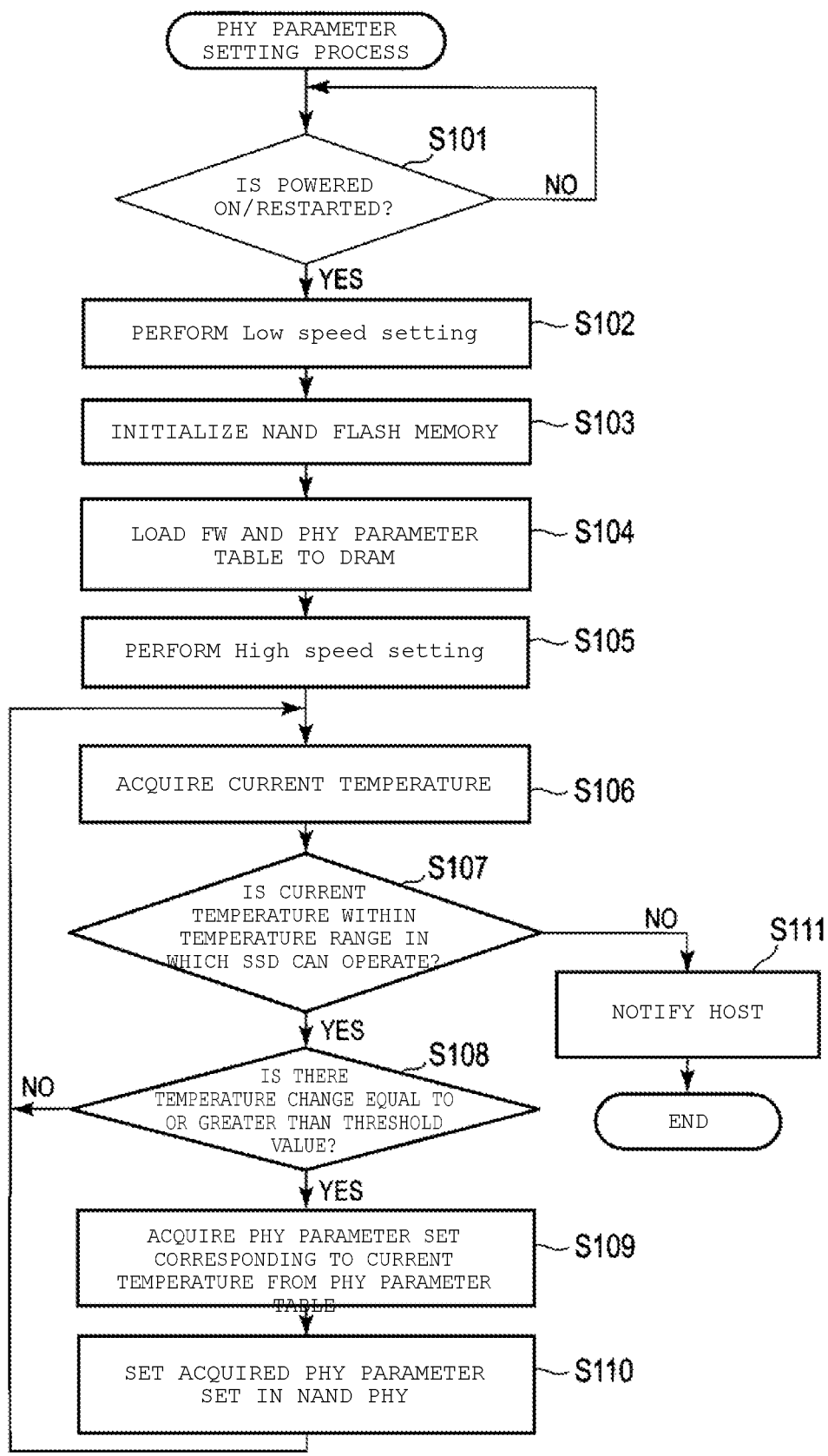
FIG. 11 is a flowchart illustrating an example of a procedure of a PHY parameter setting process executed in the memory system according to the first embodiment.

An example of a procedure of a PHY parameter setting process executed by the controller 4 will be described with reference to the flowchart of FIG. 11.

First, the controller 4 determines whether or not the SSD 3 is powered on or restarted (step S101). When it is determined that the SSD 3 is not powered on or restarted (NO in step S101), the PHY parameter setting process returns to step 101, and it is determined again whether the SSD 3 is powered on or restarted.

When it is determined that the SSD 3 is powered on or restarted (YES in step S101), the controller 4 performs low speed setting (step S102). That is, the controller 4 performs setting for operating each unit in the SSD 3 at low speed. Then, the controller 4 performs initialization for starting access to the NAND flash memory 5 (step S103). In this initialization, the controller 4 starts the NAND flash memory 5, for example, and resets various settings.

Next, the controller 4 loads the FW 21 and the PHY parameter table 22 to the DRAM 6 from the NAND flash memory 5 (step S104). As described above with reference to FIG. 10, the PHY parameter table 22 includes the plurality of PHY parameter sets respectively corresponding to the plurality of temperatures at specific intervals in the temperature range in which the SSD 3 can operate.

Then, the controller 4 performs high speed setting (step S105). That is, the controller 4 performs setting (for example, mode switching between the controller 4 and the NAND flash memory 5) for operating each unit in the SSD 3 at high speed. With this configuration, each unit in the SSD 3 can operate at higher speed than a case where low speed setting is performed. In high speed setting, setting of the PHY parameter set is not included.

Next, the controller 4 acquires the current temperature of the SSD 3 using the temperature sensor 15 (step S106). The controller 4 determines whether or not the current temperature is within the temperature range in which the SSD 3 can operate (step S107). When it is determined that the current temperature is within the temperature range in which the SSD 3 can operate (YES in step S107), the controller 4 determines whether or not there is a temperature change equal to or greater than a threshold value (step S108). For example, the controller 4 determines whether or not the acquired current temperature is changed by the threshold value or more from the temperature acquired immediately before. If the acquired current temperature is the first acquired temperature after the power is turned on or restarted, the controller 4 may determine that there is a temperature change regardless of the acquired current temperature. When it is determined that there is no temperature change (NO in step S108), the PHY parameter setting process returns to step S106 and monitoring of the temperature change is continued.

On the other hand, if there is a temperature change (YES in step S108), the controller 4 acquires a PHY parameter set corresponding to the current temperature from the PHY parameter table 22 (step S109). The controller 4 sets the acquired PHY parameter set in the NAND PHY 131 that provides the function of the physical layer in the NAND I/F 13 (step S110). More specifically, the controller 4 sets one or more PHY parameters included in the acquired PHY parameter set for one or more components in the NAND PHY 131, respectively.

The controller 4 sets the PHY parameter set in the NAND PHY 131 in step S109, and then the PHY parameter setting process returns to step S106. With this configuration, an appropriate PHY parameter set may be set in the NAND PHY 131 according to a temperature change in the memory system 3.

When it is determined that the current temperature is outside the temperature range in which the SSD 3 can operate (NO in step S107), the controller 4 interrupts an input/output process for the NAND flash memory 5, and notifies the host 2 that the current temperature of the SSD 3 exceeds the temperature range in which the SSD 3 can operate (step S111), and the PHY parameter setting process ends.

As described above, even when the temperature of the SSD 3 changes, an appropriate PHY parameter set in accordance with the current temperature is set in the NAND PHY 131, and thus high-speed access to the NAND flash memory 5 can be continued.

Second Embodiment

In the first embodiment, the PHY parameter table 22 stored in the NAND flash memory 5 at the time of shipment of the SSD 3 includes a plurality of PHY parameter sets respectively corresponding to a plurality of temperatures at specific intervals in a temperature range in which the SSD 3 can operate. In contrast, in the second embodiment, a PHY parameter set corresponding to a certain temperature is acquired based on the result of calibration/training performed while the SSD 3 is operating, and is added to the PHY parameter table 22.

The configuration of the SSD 3 according to the second embodiment is the same as that of the SSD 3 of the first embodiment, and the second embodiment differs from the first embodiment only in the procedure of the process executed by the PHY parameter control unit 123. Only the differences from the first embodiment will be described below.

When the PHY parameter table 22 includes a PHY parameter set corresponding to the current temperature acquired from the temperature sensor 15, the PHY parameter control unit 123 acquires the PHY parameter set and sets the PHY parameter set in the NAND PHY 131.

On the other hand, when the PHY parameter table 22 does not include the PHY parameter set corresponding to the current temperature, the PHY parameter control unit 123 performs calibration/training for the NAND PHY 131 and adds a PHY parameter set based on the result of the calibration/training to the PHY parameter table 22 in association with the current temperature. With this configuration, the PHY parameter table 22 can be updated to include the PHY parameter set corresponding to the current temperature. The PHY parameter control unit 123 further sets the PHY parameter set based on the calibration/training result in the NAND PHY 131.

The PHY parameter control unit 123 performs the operation described above in response to a change in the temperature of the SSD 3 while the SSD 3 is in an idle state, for example. The idle state is a state in which the SSD 3 is not performing a process in accordance with a request (for example, a write request, a read request) by the host 2, for example, and a state in which usage rates and usage amounts of various resources (CPU 12, DRAM 6, and the like) provided in the SSD 3 are less than a threshold value.

While the PHY parameter table 22 stored in the NAND flash memory 5 at the time of shipment of the SSD 3 includes, for example, a plurality of records corresponding to a plurality of temperatures at specific intervals in the temperature range in which the SSD 3 can operate, each record does not include a PHY parameter set. Alternatively, the PHY parameter control unit 123 may create such a PHY parameter table 22 in response to the startup of use of the SSD 3.

Then, once calibration/training for the NAND PHY 131 is performed on the SSD 3 at a certain temperature, the PHY parameter set based on the result of the calibration/training is added to the PHY parameter table 22 in association with the temperature. Accordingly, the PHY parameter table 22 can be completed by performing calibration/training once for each temperature.

In the second embodiment, since the PHY parameter table 22 at the time of shipment of the SSD 3 does not include the PHY parameter set, it is not necessary to perform calibration/training before shipment. Accordingly, in the second embodiment, compared with the first embodiment, the work cost required for preparing the PHY parameter table 22 before shipment of the SSD 3 can be reduced.

FIG. 12 illustrates an example of the PHY parameter table 22 updated by the PHY parameter control unit 123. In the example illustrated in FIG. 12, PHY parameter sets P25 and P26 corresponding to 25° C. and 26° C. for which calibration/training for the NAND PHY 131 is previously performed are added to the PHY parameter table 22. That is, in each record corresponding to 25° C. and 26° C. in the PHY parameter table 22, a value is set in the PHY parameter set field.

However, a PHY parameter set corresponding to a temperature (for example, 24° C.) at which calibration/training for the NAND PHY 131 is not performed is not yet added to the PHY parameter table 22. In each record corresponding to temperatures other than 25° C. and 26° C. in the PHY parameter table 22 illustrated in FIG. 12, no value is set in the PHY parameter set field.

FIG. 13 illustrates an example in which the PHY parameter table 22 illustrated in FIG. 12 is updated by performing calibration/training on the SSD 3 at a certain temperature. In the example illustrated in FIG. 13, when the current temperature of the SSD 3 is 24° C., the PHY parameter table 22 does not include a PHY parameter set corresponding to 24° C., the PHY parameter control unit 123 performs calibration/training for the NAND PHY 131. The PHY parameter control unit 123 adds a PHY parameter set P24 based on the calibration/training result to the PHY parameter table 22 in association with 24° C. That is, the PHY parameter control unit 123 sets the PHY parameter set P24 in the record corresponding to 24° C.

With this configuration, the PHY parameter set P24 corresponding to 24° C. not included in the PHY parameter table 22 may be added to the PHY parameter table 22. Similarly, when the current temperature of the SSD 3 becomes a temperature at which the PHY parameter set is not yet acquired, the PHY parameter set corresponding to the temperature may be added to the PHY parameter table 22.

Figure 14:
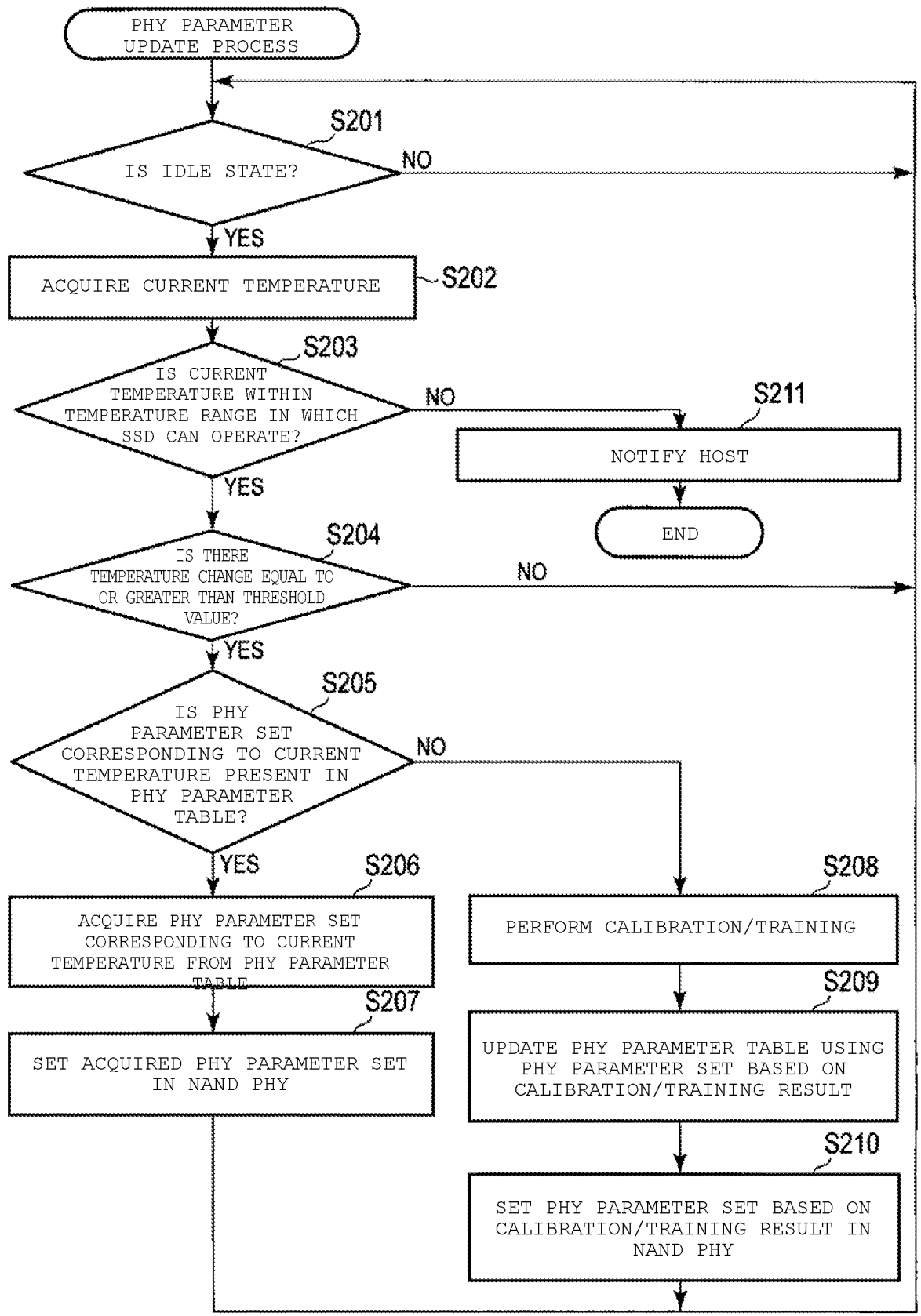
FIG. 14 is a flowchart illustrating an example of a procedure of a PHY parameter update process executed in the memory system according to the second embodiment.

A flowchart of FIG. 14 illustrates an example of a procedure of a PHY parameter update process executed by the controller 4.

First, the controller 4 determines whether or not the SSD 3 is in an idle state (step S201). When it is determined that the SSD 3 is not in the idle state (NO in step S201), the PHY parameter update process returns to step S201, and it is determined again whether or not the SSD 3 is in the idle state.

When it is determined that the SSD 3 is in the idle state (YES in step S201), the controller 4 acquires the current temperature of the SSD 3 using the temperature sensor 15 (step S202). The controller 4 determines whether or not the current temperature is within the operable temperature range of the SSD 3 (step S203). When it is determined that the current temperature is within the operable temperature range of the SSD 3 (YES in step S203), the controller 4 determines whether or not there is a temperature change equal to or greater than a threshold value (step S204). When it is determined that there is no temperature change (NO in step S204), the PHY parameter update process returns to step S201.

When it is determined that there is a temperature change (YES in step S204), the controller 4 determines whether or not a PHY parameter set corresponding to the current temperature is present in the PHY parameter table 22 (step S205). When it is determined that the PHY parameter set corresponding to the current temperature is present in the PHY parameter table 22 (YES in step S205), the controller 4 acquires the PHY parameter set corresponding to the current temperature from the PHY parameter table 22 (step S206) and sets the acquired PHY parameter set in the NAND PHY 131 (step S207).

On the other hand, when it is determined that the PHY parameter set corresponding to the current temperature is not present in the PHY parameter table 22 (NO in step S205), the controller 4 performs calibration/training for the NAND PHY 131 (step S208) and updates the PHY parameter table 22 using a PHY parameter set based on the result (step S209). More specifically, the controller 4 adds the PHY parameter set based on the result of calibration/training to a record corresponding to the current temperature in the PHY parameter table 22. Then, the controller 4 sets the PHY parameter set based on the calibration/training result in the NAND PHY 131 (step S210). The step S209 and step S210 may be executed in the reverse order or may be executed in parallel.

When it is determined that the current temperature is outside the operable temperature range of the SSD 3 (NO in step S203), the controller 4 interrupts the input/output process for the NAND flash memory 5, notifies the host 2 that the current temperature of the SSD 3 exceeds the temperature range in which the SSD 3 can operate (step S211), and the PHY parameter update process ends.

As described above, when the SSD 3 is in the idle state and the temperature acquired from the temperature sensor 15 changes, the PHY parameter set which is set in the NAND PHY 131 can be updated and the PHY parameter table 22 can be updated. That is, when the PHY parameter table 22 includes the PHY parameter set corresponding to the current temperature, the PHY parameter set is set in the NAND PHY 131. When the PHY parameter table 22 does not include the PHY parameter set corresponding to the current temperature, calibration/training for the NAND PHY 131 is performed, and the PHY parameter is set based on the result of the calibration/training is added to the PHY parameter table 22. In the SSD 3, calibration/training is performed once for each temperature, thereby capable of completing the PHY parameter table 22. By using the completed PHY parameter table 22, high-speed access to the NAND flash memory 5 can be continued even when the temperature changes.

Third Embodiment

In the first embodiment, the PHY parameter table 22 stored in the NAND flash memory 5 at the time of shipment of the SSD 3 includes a plurality of PHY parameter sets respectively corresponding to a plurality of temperatures at specific intervals in the temperature range in which the SSD 3 can operate. In the second embodiment, a PHY parameter set corresponding to a certain temperature is acquired based on the result of calibration/training performed while the SSD 3 is operating, and is added to the PHY parameter table 22. In contrast, in the third embodiment, the PHY parameter table 22 stored in the NAND flash memory 5 at the time of shipment of the SSD 3 includes a PHY parameter set corresponding to one or more of a plurality of temperatures at specific intervals in the temperature range in which the SSD 3 can operate, but does not include a PHY parameter set corresponding to one or more other temperatures.

In the third embodiment, a PHY parameter set corresponding to a certain temperature that is not included in the PHY parameter table 22 may be acquired by estimation using a PHY parameter set corresponding to several other temperatures in the PHY parameter table 22 or acquired based on the results of calibration/training performed while the SSD 3 is being used, and is added to the PHY parameter table 22. Furthermore, in the third embodiment, the PHY parameter set obtained by estimation and the PHY parameter set of which the elapsed time after being set in the PHY parameter table 22 exceeds the threshold time are respectively updated based on results of calibration/training performed while the SSD 3 is used.

In the third embodiment, since the PHY parameter table 22 at the time of shipment of the SSD 3 does not include the PHY parameter set corresponding to one or more of the plurality of temperatures in the temperature range in which the SSD 3 can operate, it is not necessary to perform calibration/training before shipment for those one or more temperatures. Accordingly, in the third embodiment, as compared with the first embodiment, the work cost required for preparing the PHY parameter table 22 before shipment of the SSD 3 can be reduced.

The configuration of the SSD 3 according to the third embodiment is the same as that of the SSD 3 of the first and second embodiments, and the third embodiment differs from the first and second embodiments only in the procedure of the process executed by the PHY parameter control unit 123. Only differences from the first and second embodiments will be described below.

FIG. 15 illustrates a configuration example of the PHY parameter table 22 stored in the NAND flash memory 5 at the time of shipment of the SSD 3. The PHY parameter table 22 is created based on the result of calibration/training performed before shipment of the SSD 3, for example, and stored in the NAND flash memory 5. Accordingly, the PHY parameter table 22 is stored in the NAND flash memory 5 of the SSD 3 at the point in time of the startup of use by the user.

The PHY parameter table 22 includes a plurality of records. The plurality of records correspond to the plurality of temperatures at specific intervals in the temperature range in which the SSD 3 can operate. Each record includes four fields, for example, a temperature, PHY parameter set, update date and time, and actual measurement/estimation.

In the record corresponding to a certain temperature, the temperature field indicates the temperature. The PHY parameter set field indicates a PHY parameter set to be set in the NAND PHY 131 when the temperature of the SSD 3 (that is, temperature measured using the temperature sensor 15) is at that temperature. One or more PHY parameters included in the PHY parameter set may be set in one or more components (circuits, elements, and the like) of the NAND PHY 131, respectively.

The update date and time field indicates the date and time when the PHY parameter set (that is, the value set in the PHY parameter set field) corresponding to the temperature was updated.

The actual measurement/estimation field indicates whether the PHY parameter set corresponding to the temperature is an actual measurement or an estimated PHY parameter set. In the actual measurement/estimation field, for example, either "actual measurement" or "estimation" may be set.

An actually-measured PHY parameter set is a PHY parameter set obtained by performing calibration/training for the NAND PHY 131. An estimated PHY parameter set is a PHY parameter set estimated using the PHY parameter table 22. More specifically, the estimated PHY parameter set corresponding to a certain temperature is a PHY parameter set which is estimated using actually-measured PHY parameter sets corresponding to some other temperatures in the PHY parameter table 22.

The PHY parameter table 22 stored in the NAND flash memory 5 at the time of shipment of the SSD 3 includes a plurality of records corresponding to a plurality of temperatures at specific intervals in the temperature range in which the SSD 3 can operate, but may not include a PHY parameter set corresponding to at least one of the plurality of temperatures.

For example, the PHY parameter table 22 at the time of shipment of the SSD 3 may be created such that the temperature intervals at which the PHY parameter sets are acquired differ in each of a plurality of temperature ranges obtained by dividing the temperature range in which the SSD 3 can operate. For example, the temperature interval at which the PHY parameter set is acquired is increased in a temperature range including the lower limit value and a temperature range including the upper limit value, while the temperature interval in which the PHY parameter set is acquired is decreased in a temperature range including the temperature assumed to be normal temperature. That is, in the temperature range including the lower limit value and the temperature range including the upper limit value, the temperature at which the PHY parameter set is acquired is set roughly, and in the temperature range including the temperature assumed to be normal temperature, the temperature at which the PHY parameter set is acquired is set finely. Accordingly, for example, the PHY parameter table 22 can be created so that a PHY parameter set is acquired at intervals of 5° C. in the temperature range from 0° C. to 20° C. including the lower limit value of 0° C. and the temperature range from 60° C. to 80° C. including the upper limit value of 80° C. and a PHY parameter set is acquired at intervals of 1° C. in a temperature range of 21° C. to 59° C. including a normal temperature of 40° C.

Alternatively, for PHY parameter table 22 at the time of shipment of the SSD 3, the PHY parameter table 22 may be created so that so that a PHY parameter set corresponding to one or more temperatures is acquired in each of the temperature range including the lower limit value, the temperature range including the upper limit value, and the temperature range including the temperature assumed to be normal temperature. Whether the PHY parameter set corresponding to any temperature is included in the PHY parameter table 22 at the time of shipment of the SSD 3 may be a predetermined set according to the environment in which the SSD 3 is assumed to be used.

In the example illustrated in FIG. 15, the PHY parameter sets corresponding to 2° C., 24° C., and 79° C. are not included in the PHY parameter table 22. In other words, in each record corresponding to 2° C., 24° C., and 79° C. in the PHY parameter table 22, no value is set in each of the PHY parameter set, update date and time, and actual measurement/estimation fields.

The PHY parameter control unit 123 performs an estimation process using the PHY parameter table 22 when the SSD 3 is powered on or restarted, or when an actually-measured PHY parameter set is added to the PHY parameter table 22. The PHY parameter table 22 includes a plurality of actually-measured PHY parameter sets respectively corresponding to a plurality of temperatures, for example. In the estimation process, the PHY parameter control unit 123 acquires one or more temperatures (in the following, also referred to as estimation target temperature) in the PHY parameter table 22 that do not include a corresponding actually-measured PHY parameter set, that is, one or more temperatures that are different from a plurality of temperatures corresponding to a plurality of actually-measured PHY parameter sets. Then, the PHY parameter control unit 123 estimates (calculates) one or more PHY parameter sets respectively corresponding to the one or more estimation target temperatures using the plurality of actually-measured PHY parameter sets.

The PHY parameter control unit 123 adds one or more estimated PHY parameter sets to the PHY parameter table 22 in association with the one or more estimation target temperatures, respectively. More specifically, the PHY parameter control unit 123 sets the estimated PHY parameter set in the PHY parameter set field in each record corresponding to one or more estimation target temperatures, sets the date and time when the PHY parameter set was estimated (or the date and time when the update was performed) in the update date and time field, and sets "estimation" in the actual measurement/estimation field.

Here, a case where a PHY parameter set corresponding to the first temperature is estimated will be exemplified. In order to make the explanation easy to understand, it is assumed that the PHY parameter set includes one parameter.

The PHY parameter control unit 123 acquires, for example, from the PHY parameter table 22, an actually-measured PHY parameter set corresponding to the second temperature which is lower than the first temperature and closest to the first temperature, and the first temperature and an actually-measured PHY parameter set corresponding to third temperature which is higher than the first temperature and closest to the first temperature. The PHY parameter control unit 123 estimates the PHY parameter set corresponding to the first temperature, for example, by linear interpolation between the actually-measured PHY parameter set corresponding to the second temperature and the actually-measured PHY parameter set corresponding to the third temperature. The PHY parameter control unit 123 adds the estimated PHY parameter set to the PHY parameter table 22 in association with the first temperature.

In the example described above, while a case in which a PHY parameter set corresponding to the first temperature is estimated by linear interpolation using two actually-measured PHY parameter sets in the PHY parameter table 22 is described, the PHY parameter set corresponding to the first temperature may be estimated by linear interpolation using more actually-measured PHY parameter sets. Various interpolation methods may be used instead of linear interpolation.

Furthermore, the PHY parameter control unit 123 may add the PHY parameter set to the PHY parameter table 22 when estimation accuracy of the estimated PHY parameter set exceeds a first threshold value. The estimation accuracy indicates, for example, reliability of the estimated PHY parameter set. The first threshold value is set such that, for example, only the estimated PHY parameter set that allows the NAND PHY 131 to operate normally is added to the PHY parameter table 22.

More specifically, in the example illustrated in FIG. 15, when a PHY parameter set corresponding to 2° C. is estimated, the PHY parameter control unit 123 acquires, from the PHY parameter table 22, an actually-measured PHY parameter set P1 corresponding to 1° C. lower than 2° C. and closest to 2° C. and an actually-measured PHY parameter set P3 corresponding to 3° C. higher than 2° C. and closest to 2° C. The PHY parameter control unit 123 estimates the PHY parameter set P2 corresponding to 2° C. by linear interpolation between the actually-measured PHY parameter set P1 corresponding to 1° C. and the actually-measured PHY parameter set P3 corresponding to 3° C., for example.

Similarly, when the two PHY parameter sets P1 and P3 include a plurality of PHY parameters to be set for a plurality of components in the NAND PHY 131, a plurality of PHY parameters used as the PHY parameter set P2 are estimated by acquiring PHY parameters for each component from the parameter sets P1 and P3 and performing linear interpolation using the PHY parameters.

The PHY parameter control unit 123 sets the estimated PHY parameter set P2 in the PHY parameter set field in the record corresponding to 2° C. When the estimation accuracy of the estimated PHY parameter set P2 exceeds the first threshold value, the PHY parameter control unit 123 may set the PHY parameter set P2 in the PHY parameter set field in the record corresponding to 2° C.

For example, when the PHY parameter set P1 and the PHY parameter set P3 used for estimation indicate the same value, the same value is estimated as the PHY parameter set P2, and the estimation accuracy increases. On the other hand, the greater the difference between the PHY parameter set P1 and the PHY parameter set P3 used for estimation, the lower the estimation accuracy of the PHY parameter set P2. For that reason, for example, the lager the variations of the plurality of PHY parameter sets used for estimation, the lower the estimation accuracy of the estimated PHY parameter set, and the smaller the variations of the plurality of PHY parameter sets used for estimation, the higher the estimation accuracy of the estimated PHY parameter set.

FIG. 16 illustrates an example in which the PHY parameter table 22 illustrated in FIG. 15 is updated using the estimated PHY parameter set. In the example illustrated in FIG. 16, a PHY parameter set P2 corresponding to 2° C. and a PHY parameter set P24 corresponding to 24° C. are estimated and added to the PHY parameter table 22.

In the record corresponding to 2° C., the PHY parameter set P2 is set in the PHY parameter set field, the update date and time (or the estimated date and time) of the PHY parameter set P2 is set in the update date and time field, and "estimation" is set in the actual measurement/estimation field. In the record corresponding to 24° C., the PHY parameter set P24 is set in the PHY parameter set field, the update date and time of the PHY parameter set P24 is set in the update date and time field, and "estimation" is set in the actual measurement/estimation field.

The PHY parameter set corresponding to 79° C. is not added to the PHY parameter table 22 because the estimation accuracy is equal to or lower than the first threshold value.

FIG. 17 illustrates an example in which the PHY parameter table 22 illustrated in FIG. 16 is updated by performing calibration/training. In the example illustrated in FIG. 17, a PHY parameter set P79 corresponding to 79° C. is acquired based on the result of calibration/training and added to the PHY parameter table 22. In the record corresponding to 79° C., the PHY parameter set P79 is set in the PHY parameter set field, the update date and time (or the actually measured date and time) of the PHY parameter set P79 is set in the update date and time field, and "actual measurement" is set in the actual measurement/estimation field.

The PHY parameter control unit 123 acquires the current temperature of the SSD 3 from the temperature sensor 15. When an actually or estimated PHY parameter set corresponding to the current temperature is present in the PHY parameter table 22, the PHY parameter control unit 123 acquires the PHY parameter set and sets the PHY parameter set in the NAND PHY 131.

When neither the actually-measured PHY parameter set corresponding to the current temperature nor the estimated PHY parameter set is present in the PHY parameter table 22, calibration/training for the NAND PHY 131 is performed, and an actual measurement PHY parameter set based on the result of the calibration/training is added to the PHY parameter table 22 in association with the current temperature. With this configuration, the PHY parameter table 22 can be updated so as to include an actually-measured PHY parameter set corresponding to the current temperature. The PHY parameter control unit 123 sets the actually-measured PHY parameter set based on the calibration/training result in the NAND PHY 131.

When the temperature of the SSD 3 changes while the SSD 3 is in an idle state, the PHY parameter control unit 123 can update the PHY parameter table 22. For example, (1) when the PHY parameter table 22 does not include a PHY parameter set corresponding to the current temperature of the SSD 3, (2) when the PHY parameter table 22 includes an estimated PHY parameter set corresponding to the current temperature of the SSD 3, or (3) when the PHY parameter table 22 includes an actual measurement PHY parameter set corresponding to the current temperature of the SSD 3 and the elapsed time since the actually-measured PHY parameter set is updated exceeds a second threshold value, the PHY parameter control unit 123 performs calibration/training for the NAND PHY 131 and updates the PHY parameter table 22 with the actually-measured PHY parameter set based on the result of the calibration/training. The PHY parameter control unit 123 may further perform the estimation process using the PHY parameter table 22 to which a new actually-measured PHY parameter set is added.

As described above, before shipment of the SSD 3 or in the cases (1) to (3) described above, the PHY parameter control unit 123 can update the PHY parameter table 22 so as to include more highly accurate actually-measured PHY parameter sets while setting either the actually-measured PHY parameter set obtained as a result of calibration/training or the estimated PHY parameter set obtained by a PHY parameter estimation process in the NAND PHY 131.

Figure 18:
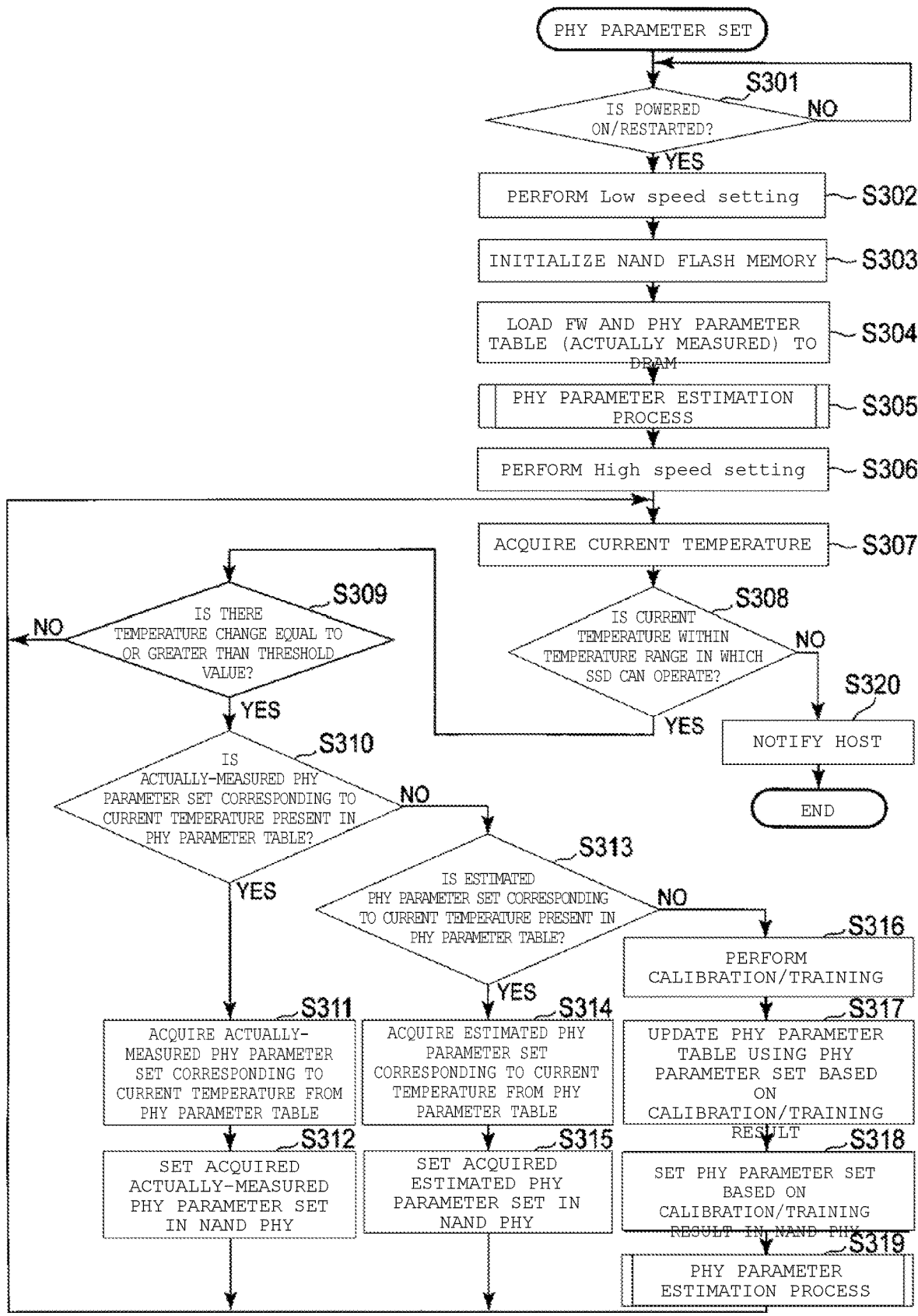
FIG. 18 is a flowchart illustrating an example of a procedure of a PHY parameter control process executed in the memory system according to the third embodiment.

The flowchart of FIG. 18 illustrates an example of a procedure of the PHY parameter setting process executed by the controller 4. The procedure from step S301 to step S304 is the same as the procedure from step S101 to step S104 described above with reference to the flowchart of FIG. 11.

After the FW 21 and the PHY parameter table 22 are loaded from the NAND flash memory 5 to the DRAM 6 in step S304, the controller 4 performs the PHY parameter estimation process (step S305). In the PHY parameter estimation process, a PHY parameter set corresponding to a temperature that is not yet subjected to calibration/training is estimated using the PHY parameter table 22. That is, in the PHY parameter estimation process, a process for setting an estimated PHY parameter set is performed for each record including an actual measurement/estimation field in which "actual measurement" is not set in the PHY parameter table 22 (that is, an actual measurement/estimation field where "estimation" is set or no value is set). A specific procedure of the PHY parameter estimation process will be described later with reference to the flowchart of FIG. 19.

Next, the controller 4 performs high speed setting (step S306). Then, the controller 4 acquires the current temperature of the SSD 3 using the temperature sensor 15 (step S307), and determines whether or not the current temperature is within the operable temperature range of the SSD 3 (step S308). When it is determined that the current temperature is within the operable temperature range of the SSD 3 (YES in step S308), the controller 4 determines whether or not there is a temperature change equal to or greater than a threshold value (step S309). For example, the controller 4 determines whether or not the acquired current temperature is changed by a threshold value or more from the temperature acquired immediately before. If the acquired current temperature is a first acquired temperature after the power is turned on or restarted, the controller 4 may determine that the temperature is changed regardless of the acquired current temperature. When it is determined that there is no temperature change (NO in step S309), the PHY parameter setting process returns to step S307, and monitoring of the temperature change is continued.

On the other hand, when it is determined that there is a temperature change (YES in step S309), the controller 4 determines whether or not an actually-measured PHY parameter set corresponding to the current temperature is present in the PHY parameter table 22 (step S310). When it is determined that the actually-measured PHY parameter set corresponding to the current temperature is present in the PHY parameter table 22 (YES in step S310), the controller 4 acquires the actually-measured PHY parameter set corresponding to the current temperature from the PHY parameter table 22 (step S311). The controller 4 sets the acquired actually-measured PHY parameter set in the NAND PHY 131 (step S312), and the PHY parameter setting process returns to step S307. By allowing the process to return to step S307, the PHY parameters may be controlled according to the new temperature change.

When it is determined that the actually-measured PHY parameter set corresponding to the current temperature is not present in the PHY parameter table 22 (NO in step S310), the controller 4 determines whether or not an estimated PHY parameter set corresponding to the current temperature is present in the PHY parameter table 22 (step S313). When it is determined that the estimated PHY parameter set corresponding to the current temperature is present in the PHY parameter table 22 (YES in step S313), the controller 4 acquires an estimated PHY parameter set corresponding to the current temperature from the PHY parameter table 22 (step S314). Then, the controller 4 sets the acquired estimated PHY parameter set in the NAND PHY 131 (step S315), and the PHY parameter setting process returns to step S307.

When it is determined that the estimated PHY parameter set corresponding to the current temperature is not present in the PHY parameter table 22 (NO in step S313), the controller 4 performs calibration/training for the NAND PHY 131 (step S316), and updates the PHY parameter table 22 using the actually-measured PHY parameter set based on the result (step S317). More specifically, the controller 4 adds an actually-measured PHY parameter set based on the calibration/training result to a record corresponding to the current temperature in the PHY parameter table 22. The controller 4 sets the actually-measured PHY parameter set based on the calibration/training result in the NAND PHY 131 (step S318). Then, the controller 4 performs the PHY parameter estimation process using the PHY parameter table 22 to which the new actually-measured PHY parameter set is added (step S319), and the PHY parameter setting process returns to step S307.

When it is determined that the current temperature is outside the operable temperature range of the SSD 3 (NO in step S308), the controller 4 interrupts the input/output process for the NAND flash memory 5, notifies the host 2 that the current temperature of the SSD 3 exceeds the temperature range in which the SSD 3 can operate (step S320), and ends the PHY parameter setting process.

Figure 19:
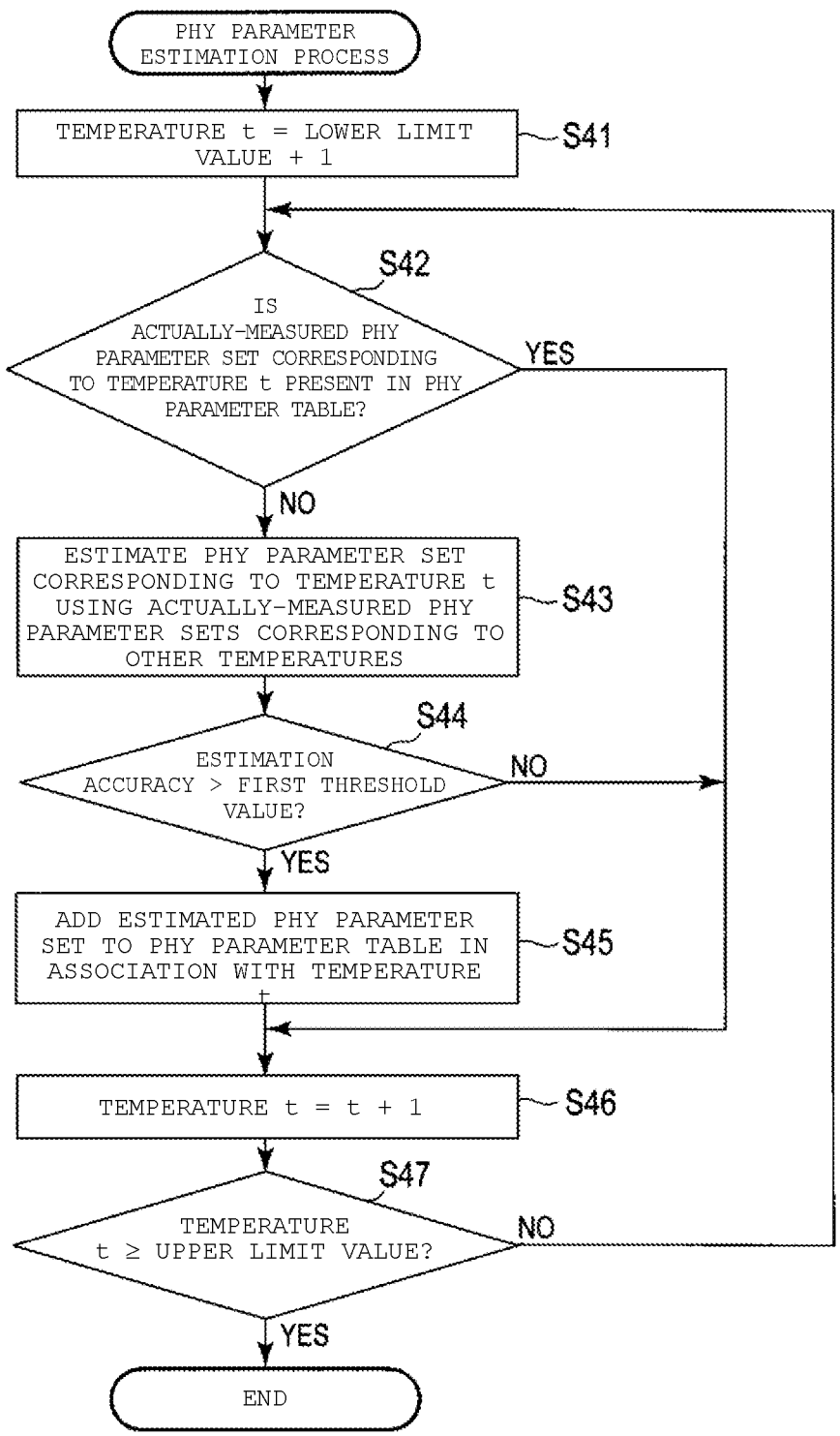
FIG. 19 is a flowchart illustrating an example of a procedure of a PHY parameter estimation process executed in the memory system according to the third embodiment.

An example of a procedure of the PHY parameter estimation process executed by the controller 4 will be described with reference to a flowchart of FIG. 19. This PHY parameter estimation process corresponds to each of steps S305 and S319 in the flowchart of FIG. 18. Here, in order to make the explanation easy to understand, a case where the PHY parameter table 22 includes a plurality of records corresponding to a plurality of temperatures at intervals of 1° C. in a temperature range in which the SSD 3 can operate is exemplified.

First, the controller 4 sets, for the temperature t, the lower limit value+1° C. of the temperature range in which the SSD 3 can operate (for example, 1° C. when the lower limit value is 0° C.) (step S41). Then, the controller 4 determines whether or not an actually-measured PHY parameter set corresponding to the temperature t is present in the PHY parameter table 22 (step S42).

When it is determined that the actually-measured PHY parameter set corresponding to the temperature t is not present in the PHY parameter table 22 (NO in step S42), the controller 4 estimates a PHY parameter set corresponding to the temperature t using the actually-measured PHY parameter sets corresponding to other temperatures in the PHY parameter table 22 (step S43). More specifically, the controller 4 acquires the actually-measured PHY parameter set corresponding to a temperature t−x that is lower than the temperature t and closest to the temperature t and a PHY parameter set corresponding to a temperature (t+y) that is higher than the temperature t and closest to the temperature t from the PHY parameter table 22. The PHY parameter control unit 123 estimates the PHY parameter set corresponding to the temperature t, for example, by linear interpolation between an actually-measured PHY parameter set corresponding to the temperature (t−x) and an actually-measured PHY parameter set corresponding to the temperature (t+y). The x and y are positive integers.

Next, the controller 4 determines whether or not the estimation accuracy of the estimated PHY parameter set exceeds the first threshold value (step S44). When it is determined that the estimation accuracy of the estimated PHY parameter set exceeds the first threshold value (YES in step S44), the controller 4 adds the estimated PHY parameter set to the PHY parameter table 22 in association with the temperature t (step S45), the process proceeds to step S46.

When it is determined that the estimated accuracy of the estimated PHY parameter set is less than or equal to the first threshold value (NO in step S44), step S45 is skipped and the process proceeds to step S46.

When it is determined that the actually-measured PHY parameter set corresponding to the temperature t is present in the PHY parameter table 22 (YES in step S42), the procedure from step S43 to step S45 is skipped, and the process proceeds to step S46.

In step S46, the controller 4 adds 1 to the temperature t. Then, the controller 4 determines whether or not the temperature t is equal to or higher than the upper limit value (for example, 80° C.) of the temperature range in which the SSD 3 can operate (step S47). When it is determined that the temperature t is less than the upper limit value of the temperature range in which the SSD 3 can operate (NO in step S47), the PHY parameter estimation process returns to step S42, and the process for estimating the PHY parameter set is continued.

On the other hand, when it is determined that the temperature t is equal to or higher than the upper limit of the temperature range in which the SSD 3 can operate (YES in step S47), the PHY parameter estimation process ends.

As described above, by using the PHY parameter table 22, a PHY parameter set corresponding to a temperature for which calibration/training is not yet performed may be estimated.

Figure 20:
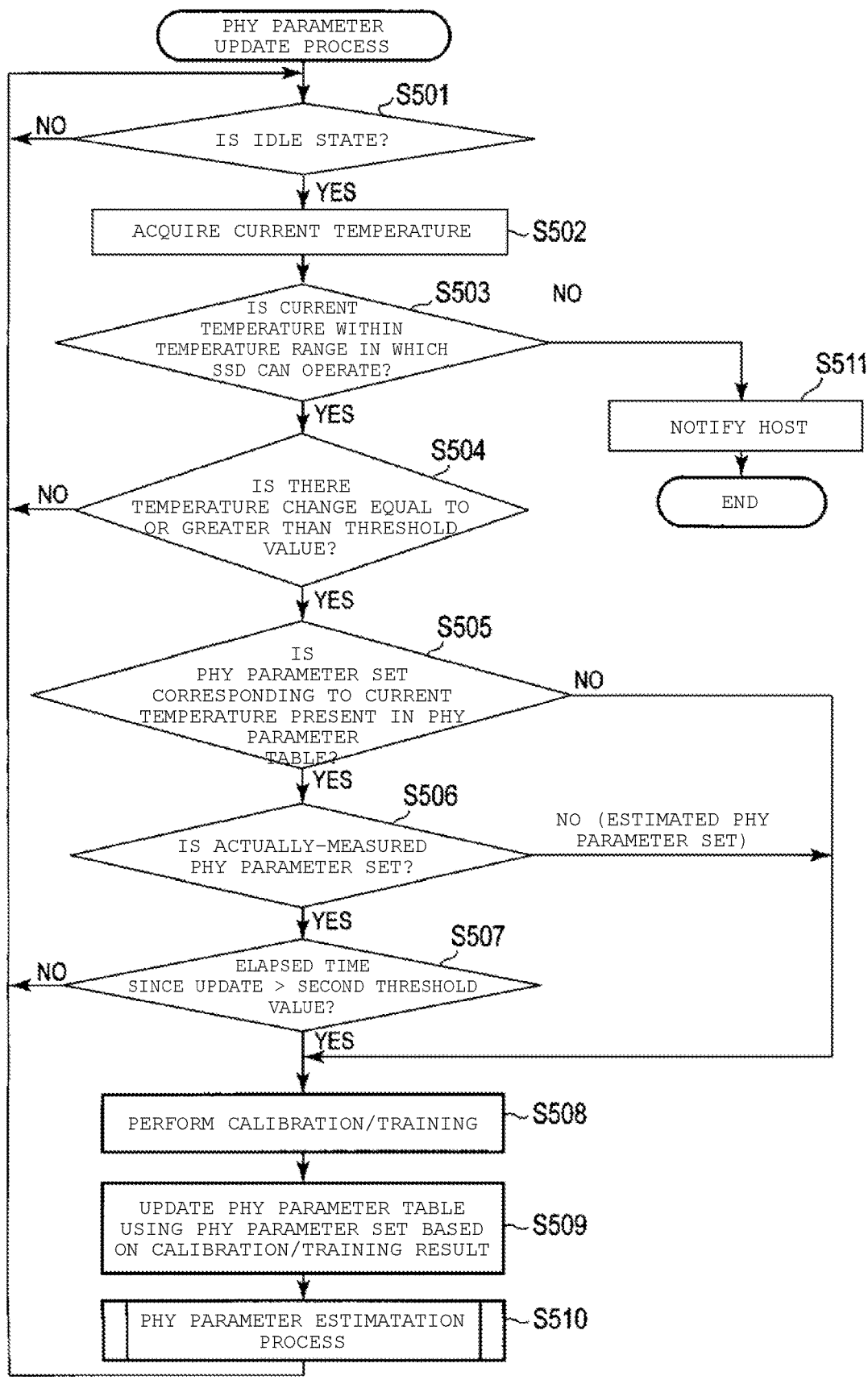
FIG. 20 is a flowchart illustrating an example of a procedure of a PHY parameter update process executed in the memory system according to the third embodiment.

A flowchart of FIG. 20 illustrates an example of a procedure of the PHY parameter update process executed by the controller 4. The procedure from step S501 to step S505 of the PHY parameter update process and the procedure of step S511 are the same as the procedure from step S201 to step S205 and the procedure of step S211 described above with reference to the flowchart of FIG. 14, respectively.

When it is determined that the PHY parameter set corresponding to the current temperature is present in the PHY parameter table 22 (YES in step S505), the controller 4 determines whether or not the PHY parameter set corresponding to the current temperature is an actually-measured PHY parameter set (step S506). When it is determined that the PHY parameter set corresponding to the current temperature is the actual measurement PHY parameter set (YES in step S506), the controller 4 determines whether or not the elapsed time since the actual measurement PHY parameter set is updated exceeds the second threshold value (step S507). More specifically, the controller 4 acquires the update date and time which is set in the update date and time field from the record including the actually-measured PHY parameter set in the PHY parameter table 22, and determines whether or not the difference between the current date and time and the acquired update date and time exceeds the second threshold value. When it is determined that the elapsed time since the actually-measured PHY parameter set corresponding to the current temperature is updated is equal to or less than the second threshold value (NO in step S507), the PHY parameter update process returns to step S501.

When it is determined that the elapsed time since the actually-measured PHY parameter set corresponding to the current temperature is updated exceeds the second threshold value (NO in step S507), when it is determined that the PHY parameter set corresponding to the current temperature is not present in the PHY parameter table 22 (NO in step S505), or when it is determined that the PHY parameter set corresponding to the current temperature is the estimated PHY parameter set (NO in step S506), the controller 4 performs calibration/training for the NAND PHY 131 (step S508), and updates the PHY parameter table 22 using the actually-measured PHY parameter set based on the result (step S509). More specifically, the controller 4 adds an actual measurement PHY parameter set based on the calibration/training result to a record corresponding to the current temperature in the PHY parameter table 22.

Then, the controller 4 performs the PHY parameter estimation process (step S510), and the PHY parameter update process returns to step S501. That is, the controller 4 performs the PHY parameter estimation process using the PHY parameter table 22 to which a new actually-measured PHY parameter set is added, and then the PHY parameter update process returns to step S501. The procedure of the PHY parameter estimation process is as described above with reference to the flowchart of FIG. 19.

As described above, calibration/training for acquiring the actually-measured PHY parameter set is performed while the SSD 3 is in the idle state. With this configuration, the PHY parameter table 22 can be updated so that a PHY parameter set more suitable for the actual operation of the SSD 3 is set.

The configuration for performing the PHY parameter estimation process described above may be applied to the PHY parameter control unit 123 of the second embodiment.

The PHY parameter control unit 123 can update the PHY parameter table 22 so as to include more actually-measured PHY parameter sets while setting either the actually-measured PHY parameter set obtained as the result of calibration/training or the estimated PHY parameter set obtained by the PHY parameter estimation process in the NAND PHY 131.

As described above, according to the first to third embodiments, high-speed access to a nonvolatile memory (for example, the NAND flash memory 5) can be continued even when the temperature changes. The NAND flash memory 5 stores the PHY parameter table 22 including a plurality of PHY parameter sets respectively corresponding to a plurality of temperatures. The controller 4 includes the NAND PHY 131 that controls access to the NAND flash memory 5. The temperature sensor 15 measures the temperature in the SSD 3. The controller 4 (more specifically, the PHY parameter control unit 123) loads the PHY parameter table 22 from the NAND flash memory 5 to the DRAM 6 in response to the startup of the SSD 3. The controller 4 acquires the first temperature from the temperature sensor 15, acquires the first parameter set corresponding to the first temperature from the PHY parameter table 22, and sets the first parameter set in the NAND PHY 131.

As such, since the PHY parameter set in accordance with the first temperature is acquired from the PHY parameter table 22 and is set in the NAND PHY 131, high-speed access to the NAND flash memory 5 can be continued even when the temperature changes.

Each of the various functions described in the first to third embodiments may be implemented by a circuit (processing circuit). Examples of the processing circuit include a programmed processor, such as a central processing unit (CPU). This processor provides each of functions described above by executing a computer program (instruction group) stored in a memory. The processor may be a microprocessor that includes an electric circuit. Examples of the processing circuits also include a digital signal processor (DSP), an application specific integrated circuit (ASIC), a microcontroller, a controller, and other electric circuit components. Each of the components other than the CPU described in these embodiments may also be implemented by the processing circuit.

While certain embodiments have been described, these embodiments have been presented by way of example only, and are not intended to limit the scope of the inventions described herein. Indeed, the novel embodiments described herein may be embodied in a variety of other forms. Furthermore, various omissions, substitutions and changes in the form of the embodiments described herein may be made without departing from the spirit of the inventions described herein. The accompanying claims and their equivalents are intended to cover such forms or modifications as would fall within the scope and spirit of the inventions described herein.

What is claimed is:

1. A memory system comprising:
a nonvolatile memory;
a controller that includes an interface circuit configured to control an access to the nonvolatile memory; and
a temperature sensor for measuring a temperature of the memory system,
wherein the controller is configured to:
acquire a first temperature from the temperature sensor,
acquire a first parameter set corresponding to the first temperature from parameter information including a plurality of parameter sets respectively corresponding to a plurality of temperatures, and
set the first parameter set in the interface circuit.

2. The memory system according to claim 1, wherein the parameter information is stored in the nonvolatile memory.

3. The memory system according to claim 2, further comprising:
a random access memory,
wherein the controller is configured to load the parameter information into the random access memory in response to startup of the memory system.

4. The memory system according to claim 1, wherein the first parameter set includes one or more parameters, and
the controller is configured to set the one or more parameters to one or more components of the interface circuit, respectively.

5. The memory system according to claim 1, wherein the controller is further configured to:
obtain a second temperature after the first temperature is obtained from the temperature sensor,
acquire a second parameter set corresponding to the second temperature from the parameter information when the second temperature is different from the first temperature by at least a threshold value, and
set the second parameter set in the interface circuit.

6. The memory system according to claim 1, wherein the controller is further configured to:
acquire the first parameter set when the first parameter set corresponding to the first temperature is included in the parameter information, and set the first parameter set in the interface circuit, and
perform at least one of calibration and training for the interface circuit when a parameter set corresponding to the first temperature is not included in the parameter information, add a third parameter set based on a result of performing at least one of the calibration and the training, to the parameter information in association with the first temperature, and set the third parameter set in the interface circuit.

7. The memory system according to claim 1, wherein the controller is further configured to:
acquire a fourth temperature from the temperature sensor when the memory system is in an idle state, and
perform at least one of calibration and training for the interface circuit when a parameter set corresponding to the fourth temperature is not included in the parameter information, add a fourth parameter set based on a result of performing at least one of the calibration and the training, to the parameter information in association with the fourth temperature, and set the fourth parameter set in the interface circuit.

8. The memory system according to claim 1, wherein
the parameter information is stored in the nonvolatile memory and the parameter information stored in the nonvolatile memory includes a plurality of actually measured parameter sets respectively corresponding to a plurality of fifth temperatures, and
the controller is further configured to:
load the parameter information into a random access memory from the nonvolatile memory in response to startup of the memory system,
calculate one or more estimated parameter sets including a first estimated parameter set respectively corresponding to one or more temperatures different from the plurality of fifth temperatures using the parameter information, and
add the one or more estimated parameter sets to the parameter information in association with the one or more temperatures, respectively.

9. The memory system according to claim 8, wherein the controller is further configured to add the first estimated parameter set to the parameter information when an estimation accuracy of the first estimated parameter set exceeds a first threshold value.

10. The memory system according to claim 8, wherein the controller is further configured to:
acquire a sixth temperature measured with the temperature sensor,
acquire an actually measured parameter set corresponding to the sixth temperature from the parameter information when the actually measured parameter set corresponding to the sixth temperature is included in the parameter information, and set the actually measured parameter set corresponding to the sixth temperature in the interface circuit,
acquire an estimated parameter set corresponding to the sixth temperature from the parameter information when the estimated parameter set corresponding to the sixth temperature is included in the parameter information, and set the estimated parameter set corresponding to the sixth temperature in the interface circuit, and
perform at least one of calibration and training for the interface circuit when neither the actually measured parameter set corresponding to the sixth temperature nor the estimated parameter set corresponding to the sixth temperature is included in the parameter information, add the actually measured parameter set corresponding to the sixth temperature based on a result of performing at least one of the calibration and the training to the parameter information in association with the sixth temperature, and set the actually measured parameter set corresponding to the sixth temperature in the interface circuit.

11. The memory system according to claim 8, wherein the controller is further configured to:
acquire a seventh temperature measured by the temperature sensor when the memory system is in an idle state,
perform at least one of calibration and training for the interface circuit when an actually measured parameter set corresponding to the seventh temperature is included in the parameter information and an elapsed time since the actually measured parameter set corresponding to the seventh temperature is updated exceeds a second threshold value and update the actually measured parameter set corresponding to the seventh temperature in the parameter information with a parameter set based on a result of performing at least one of the calibration and the training, and
perform at least one of calibration and training for the interface circuit when an estimated parameter set corresponding to the seventh temperature is included in the parameter information and update the estimated parameter set corresponding to the seventh temperature in the parameter information with a parameter set based on a result of performing at least one of the calibration and the training.

12. The memory system according to claim 1, wherein the controller includes the temperature sensor.

13. A memory system comprising:
a nonvolatile memory;
a controller that includes an interface circuit configured to control an access to the nonvolatile memory; and a temperature sensor for measuring a temperature of the memory system, wherein the controller is configured to:
perform calibration and training of the nonvolatile memory,
add a first parameter set to a parameter set table based on the results of the calibration and training of the nonvolatile memory,
acquire a first temperature of the nonvolatile memory from the temperature sensor, and
set an operating condition of the interface circuit based on both the first parameter set and the first temperature.

14. The memory system according to claim 13, wherein the parameter set table is stored in the nonvolatile memory.

15. The memory system according to claim 14, further comprising:
a random access memory,
wherein the controller is configured to load the parameter set table into the random access memory in response to startup of the memory system.

16. The memory system according to claim 13, wherein the controller includes the temperature sensor.

17. A memory system comprising:
a nonvolatile memory;
a controller that includes an interface circuit configured to control an access to the nonvolatile memory; and
a temperature sensor for measuring a temperature of the memory system,
wherein the controller is configured to:
acquire a first temperature of the nonvolatile memory from the temperature sensor at a first point in time,
acquire a first parameter set corresponding to the first temperature from parameter information including a plurality of parameter sets respectively corresponding to a plurality of temperatures,
acquire a second temperature of the nonvolatile memory from the temperature sensor at a second point in time after the first point in time,
acquire a second parameter set corresponding to the second temperature from the parameter information,
acquire a third temperature of the nonvolatile memory from the temperature sensor at a third point in time after the first and second points in time, and
set an operating condition in the interface circuit based on an interpolation operation performed based on the first, second, and third temperatures, and the first and second parameter sets.

18. The memory system according to claim 17, wherein the first and second parameter sets are stored in the nonvolatile memory.

19. The memory system according to claim 18, further comprising:
a random access memory,
wherein the controller is configured to load the first and second parameter sets into the random access memory in response to startup of the memory system.

20. The memory system according to claim 17, wherein the controller includes the temperature sensor.

* * * * *